(12) United States Patent
Davis et al.

(10) Patent No.: US 6,447,232 B1
(45) Date of Patent: *Sep. 10, 2002

(54) SEMICONDUCTOR WAFER PROCESSING APPARATUS HAVING IMPROVED WAFER INPUT/OUTPUT HANDLING SYSTEM

(75) Inventors: Jeffry A. Davis; Kert L. Dolechek, both of Kalispell; Gary L. Curtis, Kila, all of MT (US)

(73) Assignee: Semitool, Inc., Kalispell, MT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,737

(22) Filed: Dec. 19, 1997

Related U.S. Application Data

(63) Continuation-in-part of application No. 08/851,480, filed on May 5, 1997, now abandoned, which is a continuation-in-part of application No. 08/622,349, filed on Mar. 26, 1996, now Pat. No. 5,784,797, which is a continuation-in-part of application No. 08/236,424, filed on Apr. 28, 1994, now Pat. No. 5,544,421.

(51) Int. Cl.$^7$ .............................................. B65G 49/07
(52) U.S. Cl. .................... 414/217.1; 118/719; 414/939; 414/940; 414/331.04; 414/217; 414/225.01; 414/416.01; 414/416.09; 414/283; 454/187
(58) Field of Search ........................... 414/217, 225.01, 414/935, 937, 940, 941, 939, 17.1, 331.04, 331.02, 416.01, 416.09, 416.11, 281–283; 118/719; 454/187; 206/710, 454

(56) References Cited

U.S. PATENT DOCUMENTS

| | | |
|---|---|---|
| 4,568,234 A | 2/1986 | Lee et al. .................... 414/404 |
| 4,886,412 A | 12/1989 | Wooding et al. |
| 5,215,420 A | 6/1993 | Hughes et al. |
| 5,364,219 A | 11/1994 | Takahashi et al. |
| 5,451,131 A * | 9/1995 | Hecht et al. ............ 414/940 X |
| 5,544,421 A | 8/1996 | Thompson et al. |
| 5,562,383 A * | 10/1996 | Iwai et al. .............. 414/937 X |
| 5,613,821 A | 3/1997 | Muka et al. |
| 5,660,517 A | 8/1997 | Thompson et al. |
| 5,664,337 A | 9/1997 | Davis et al. |
| 5,674,039 A | 10/1997 | Walker et al. |

(List continued on next page.)

Primary Examiner—Frank E. Werner
(74) Attorney, Agent, or Firm—Lyon & Lyon LLP

(57) ABSTRACT

A processor for processing articles, such as semiconductor wafers, in a substantially clean atmosphere is set forth. The processor includes an enclosure defining a substantially enclosed clean processing chamber and at least one processing station disposed in the processing chamber. An interface section is disposed adjacent an interface end of the enclosure. The interface section includes at least one interface port through which a pod containing articles for processing are loaded or unloaded to or from the processor. The interface section is hygienically separated from the processing chamber since the interface section is generally not as clean as the highly hygienic processing chamber. An article extraction mechanism adapted to seal with the pod is employed. The mechanism is disposed to allow extraction of the articles contained within the pod into the processing chamber without exposing the articles to ambient atmospheric conditions in the interface section. The article processor also preferably includes an article insertion mechanism that is adapted to seal with a pod disposed in the interface section. The article insertion mechanism is disposed to allow insertion of the articles into the pod after processing by the at least one processing station. The article insertion mechanism allows the insertion of the articles without exposing the articles to ambient atmospheric conditions in the interface section.

30 Claims, 18 Drawing Sheets

U.S. PATENT DOCUMENTS

| | | | |
|---|---|---|---|
| 5,674,123 A | * 10/1997 | Robertson, Jr. et al. | 414/940 X |
| 5,678,320 A | 10/1997 | Thompson et al. | |
| 5,772,386 A | * 6/1998 | Mages et al. | |
| 5,784,797 A | 7/1998 | Curtis et al. | |
| 5,784,802 A | 7/1998 | Thompson et al. | |
| 5,788,448 A | * 8/1998 | Wakamori et al. | 414/940 X |
| 5,836,736 A | 11/1998 | Thompson et al. | |
| 5,944,475 A | * 8/1999 | Bonora et al. | 414/940 X |

* cited by examiner

SEMICONDUCTOR WAFER PROCESSING APPARATUS HAVING IMPROVED WAFER INPUT/OUTPUT HANDLING SYSTEM This Application is a Continuation-in-Part of Ser. No. 08/851,480, filed May 5, 1997, now abandoned, which is a Continuation-in-Part of Ser. No. 08/622,349, filed Mar. 26, 1996, now U.S. Pat. No. 5,784,797, which is a Continuation-in-Part of U.S. patent application Ser. No. 08/236,424 filed Apr. 28, 1994, and now U.S. Pat. No. 5,544,421; Ser. No. 08/415,927 filed Mar. 31, 1995, now U.S. Pat. No. 5,660,517; and Ser. No. 08/415,240, filed Apr. 3, 1995, now U.S. Pat. No. 5,678,320. U.S. patent application Ser. Nos. 08/851,480; 08/622,349; and 08/236,424 are incorporated herein by reference. Priority to these applications is claimed under 35 U.S.C. § 120.

STATEMENT REGARDING FEDERALLY SPONSORED RESEARCH OR DEVELOPMENT

Not Applicable

BACKGROUND OF THE INVENTION

The present invention relates to an automated semiconductor wafer processing apparatus that is used, for example, to execute liquid and gaseous processing of wafers. Such an apparatus can be used to process semiconductor wafers, data disks, semiconductor substrates and similar articles requiring very low contaminant levels. More particularly, the present invention relates to such an apparatus having an improved input/output wafer handling system.

The processing of semiconductor wafers and the like has become of great economic significance due to the large volume of integrated circuits, data disks, and similar articles being produced. In recent years, the features used in integrated circuits and data disks have decreased significantly in size, thus providing greater integration and greater capacity. In addition, the diameters of semiconductor wafers have increased over time, providing greater economies of scale with respect to each processed wafer.

While the apparatus and methods utilized heretofore for processing semiconductor wafers have operated with varying degrees of success, they have also sometimes suffered problems with regard to contamination or particle additions which can occur during processing. As the features and geometries of the discrete components formed on the semiconductor devices have become smaller and more densely packed, and as the diameters of the semiconductor wafers have increased, the need for more stringent control over contamination and breakage has become more acute.

A constant challenge in the production of semiconductors is the culmination of particle contamination. With respect to all types of semiconductor processors, preventing contaminant particles from entering into the processor enclosure is of paramount importance. Such particles can affect the photographic processes used to transfer the integrated circuit layouts onto the wafers being processed by causing deterioration of the image being transferred onto the wafer. Contaminant particles may also result in the altering of the characteristics of the device that is being manufactured.

One of the greatest sources of contaminating particles is the presence of environmental dust carried in the air surrounding the semiconductor processors. To reduce the amount of environmental contamination, semiconductor integrated circuit manufacturers have taken extreme measures to provide working areas with relatively low amounts of environmental dust. These areas are called "clean rooms".

Such working areas are expensive to build and operate. It is therefore preferable to limit the number and size of the clean rooms used to manufacture a particular device.

Another problem associated with traditional semiconductor processors relates to the fact that toxic and corrosive processing fluids, such as acids, caustics, solvents and other processing fluids are used in the manufacturing process. Such processing fluids must be maintained within controlled processing chambers to avoid corrosion and other harmful effects to personnel and materials outside of the semiconductor processor enclosure. Of concern are both liquid and gaseous forms of processing fluids, both of which should be prevented from exiting the processor chamber and contacting machine parts susceptible to corrosion. Thus, there exists a need to provide semiconductor processing equipment that adequately seals processing fluids inside the processing chamber during manufacturing and prevents them from escaping and causing damage.

The present inventors have recognized the foregoing problems and have addressed solutions for them in the apparatus described herein. The apparatus provides an improved system for batch wafer handling in automated semiconductor process equipment. Further, the apparatus provides a processing system which permits use of standard wafer containers or pods. Still further, the apparatus provides a processing system for multiple wafer container loading wherein air infiltration during the loading operation is minimized while also allowing continuous automated processing of the wafers.

In accordance with a further feature of the present apparatus, the apparatus is provided with an improved door actuating and sealing assembly that provides a fluid tight seal which prevents contaminant particles from entering a processing chamber and prevents processing fluids and vapors from escaping from the chamber.

BRIEF SUMMARY OF THE INVENTION

A processor for processing articles, such as semiconductor wafers, in a substantially clean atmosphere is set forth. The processor includes an enclosure defining a substantially enclosed clean processing chamber and at least one processing station disposed in the processing chamber. An interface section is disposed adjacent an interface end of the enclosure. The interface section includes at least one interface port through which a pod containing articles for processing are loaded or unloaded to or from the processor. The interface section is hygienically separated from the processing chamber since the interface section is generally not as clean as the highly hygienic processing chamber. An article extraction mechanism adapted to seal with the pod is employed. The mechanism is disposed to allow extraction of the articles contained within the pod into the processing chamber without exposing the articles to ambient atmospheric conditions in the interface section. The article processor also preferably includes an article insertion mechanism that is adapted to seal with a pod disposed in the interface section. The article insertion mechanism is disposed to allow insertion of the articles into the pod after processing by the at least one processing station. The article insertion mechanism allows the insertion of the articles without exposing the articles to ambient atmospheric conditions in the interface section.

BRIEF DESCRIPTION OF THE SEVERAL VIEWS OF THE DRAWINGS

FIG. 9b is a rear perspective view of the wafer transfer comb illustrated in FIG. 9a.

DETAILED DESCRIPTION OF THE INVENTION

Figure 1A:
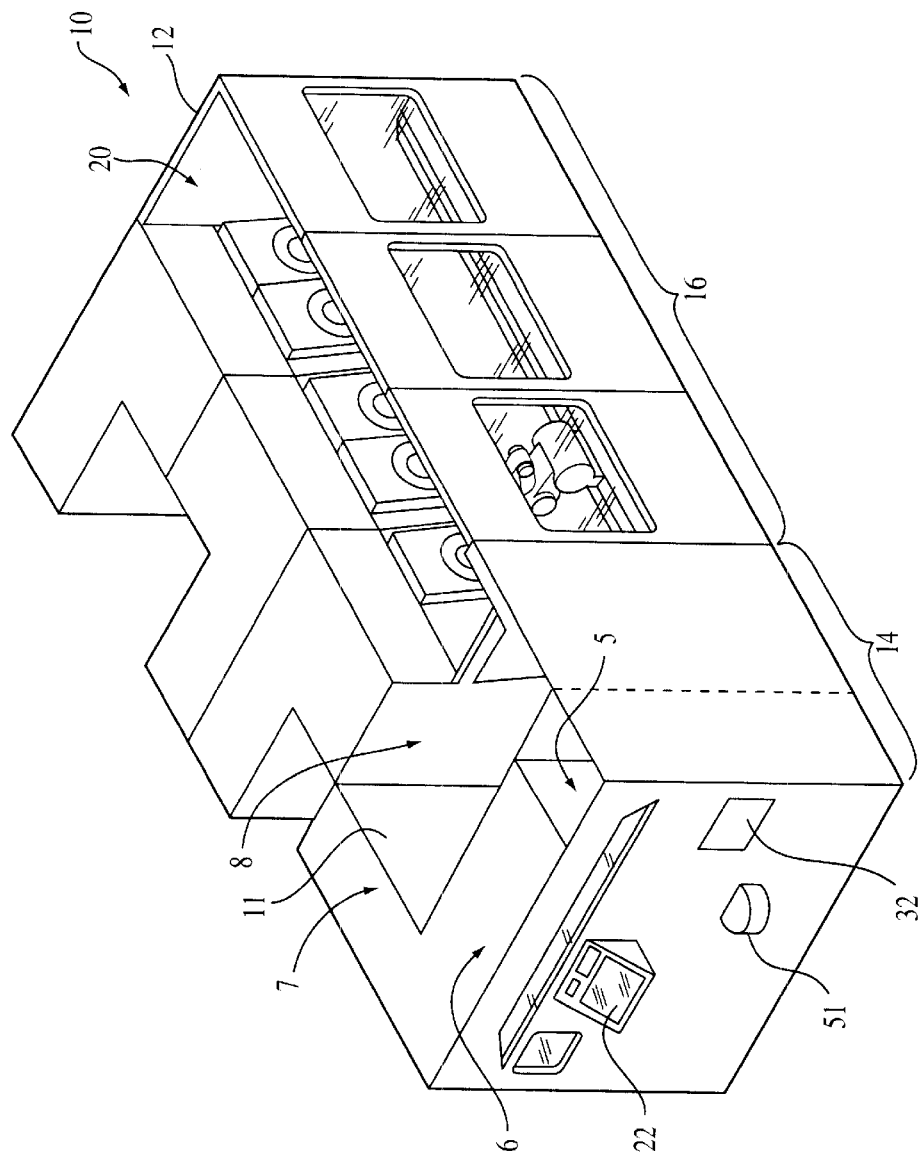
FIG. 1A is a perspective view of a semiconductor processing system in accordance with one embodiment of the invention showing the various stations of the input/output section and the general components of the processing section.
Figure 1B:
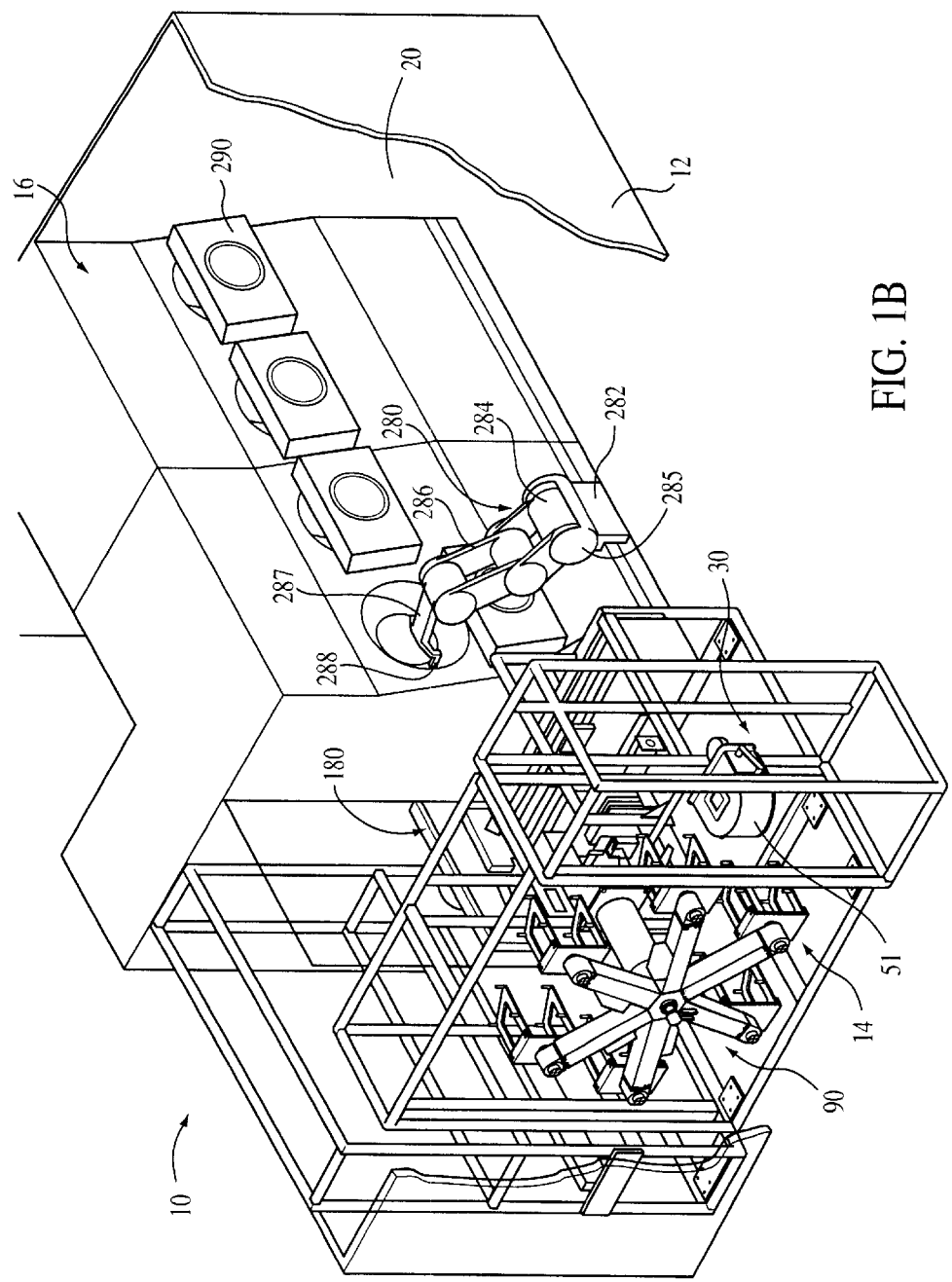
FIG. 1B is a front perspective view of a semiconductor processing system according to the present invention with portions broken away to better illustrate some of the principal components thereof.
Figure 2:
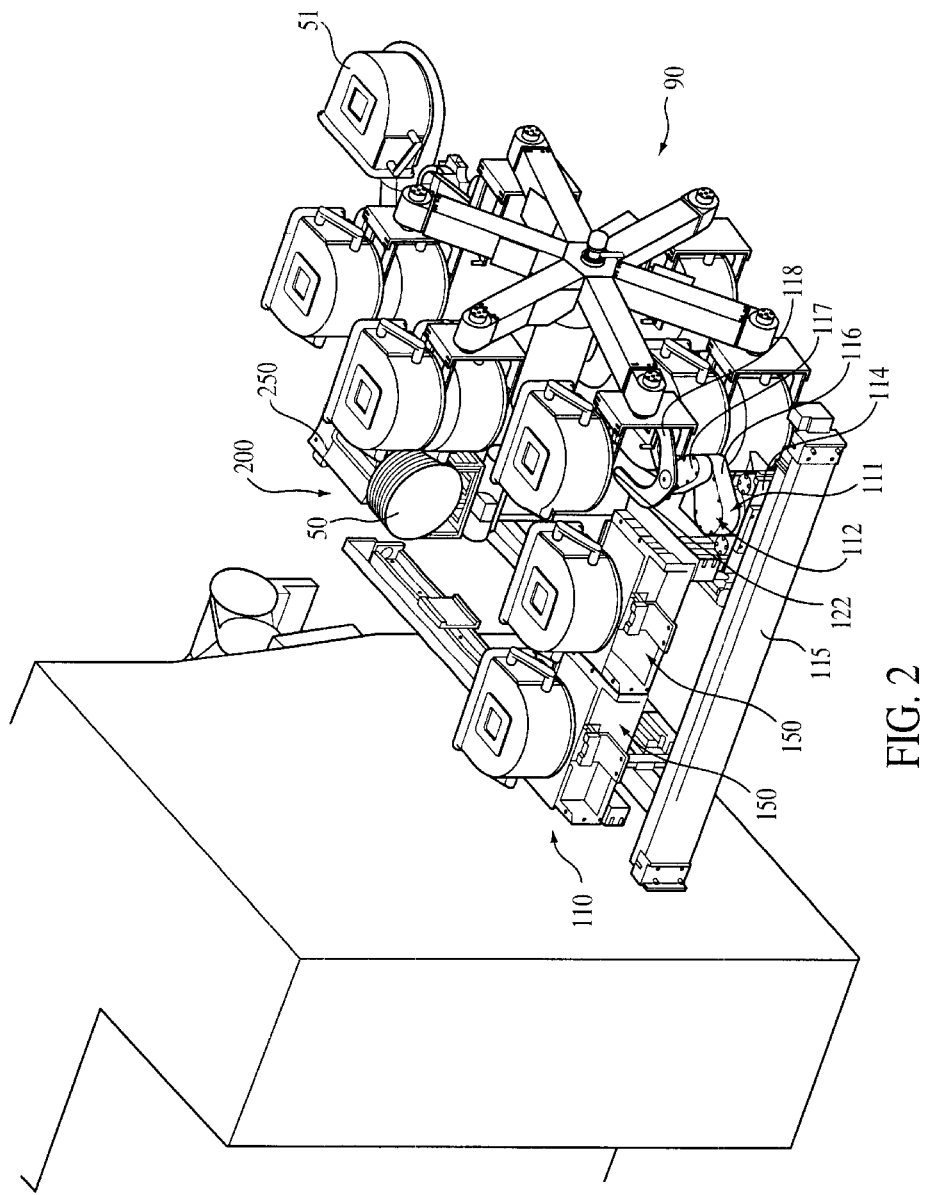
FIG. 2 is a rear perspective view of the semiconductor processing system with some portions removed to better illustrate certain components.
Figure 3:
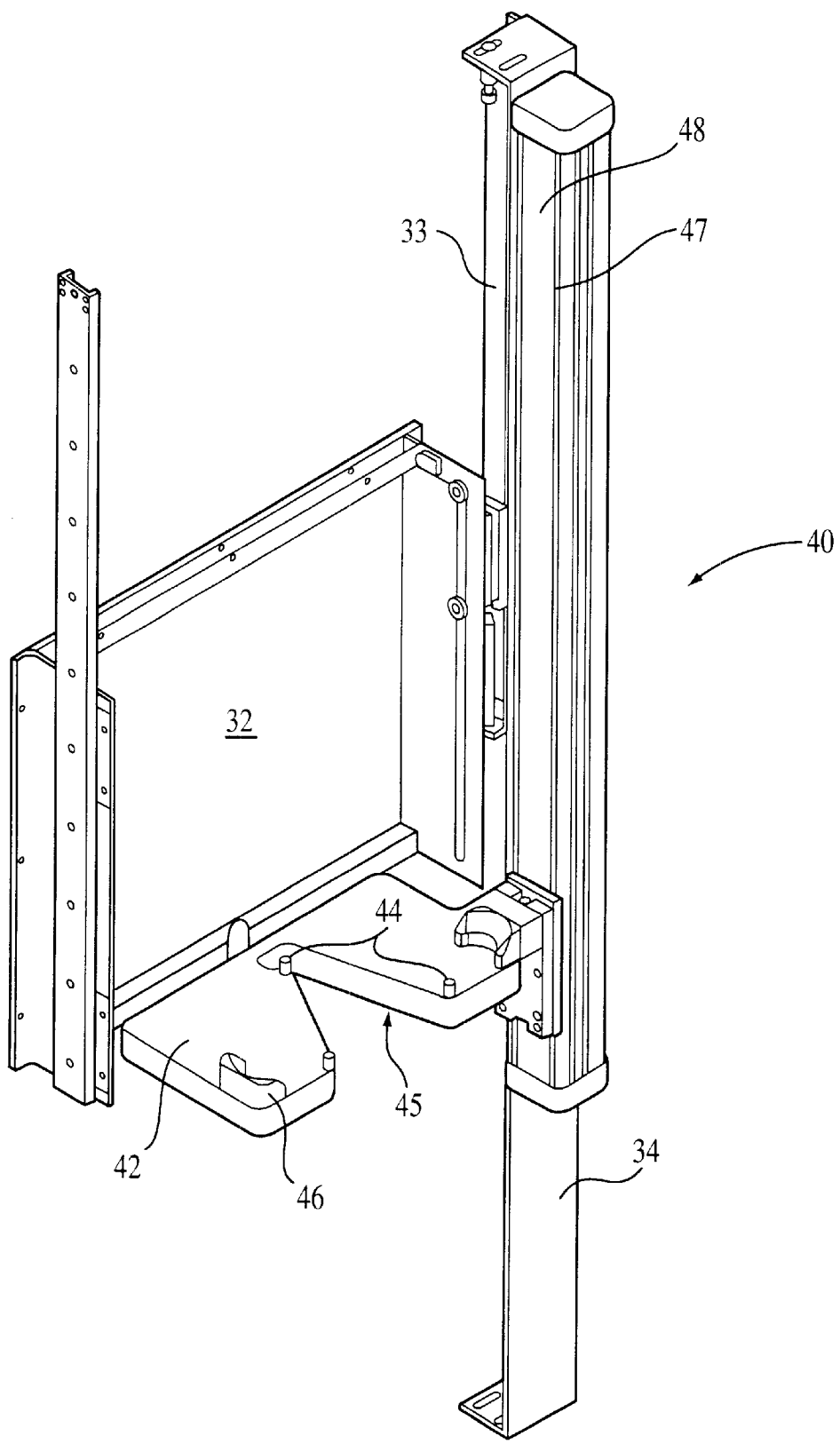
FIG. 3 is a perspective view of an input/output subassembly of the processing system illustrated in FIG. 1.

FIGS. 1A, 1B, and 2 generally illustrate a processing system 10 which includes a basic frame 12 defining the walls of the processing system 10. Generally stated, the processing system 10 is divided into two principal sections—an interface section 14 for receiving and inventorying semiconductor articles, and a processing section 16, which contains one or more processing stations 3 for processing the semiconductor articles using, for example, liquid and/or gaseous processing procedures.

As illustrated, the interface section 14 is preferably divided into a plurality of stations. In the disclosed embodiment, the interface section 14 is comprised of a container access station 5, an inventory station 6, a container docking station 7, and a wafer transfer station 8. In operation, wafer containers 51 are inserted into the processing system 10 through a door 32 at container access station 5. Each container 51 is then stored at the inventory station 6 until such time as the container is accessed by the components of the container docking station 7. A wall 11 effectively separates the stations 5, 6, and 7, from the wafer transfer station 8. To this end, wall 11 is provided with one or more doors against which each container 51 may seal and allow direct access of the wafers contained in the container 51 without contamination by the exterior surfaces of container 51. As such, the wafers in any given container 51 may be inserted into the processing section 16 of the processing system 10 without exposure to potentially contaminating environments.

With reference to FIGS. 1A and 1B, the frame 12 is constructed to form an enclosure that substantially encloses the processing system components and defines a working space 20. The semiconductor articles, such as semiconductor wafers, are held and maneuvered within the working space 20 in relative protection from dust and contamination. The working space 20 can be supplied with purge gas and/or operated at either slightly elevated pressures relative to ambient atmospheric pressure.

The upper portions of processing system 10 are sealed with respect to the ambient environment and may be provided with an interface filter above the interface section 14 and a processing filter above the processing section 16 to provide the requisite filtering of ambient air before it enters the processing area 20. These filter sections preferably employ HEPA type ultrafiltration filters. Air moving equipment, such as fans or the like forces air through the filters and downwardly into the working space 20.

The processing system 10 also has a process station maintenance section and an instrumentation and control section that are separated from the work space 20 by portions of the frame 12. Since these sections potentially have higher contamination levels due to the presence and operation of various equipment components associated with the processing stations, it is preferable to separate these sections from work space 20. The processing system 10 is preferably mounted in a wafer fabrication facility with clean room access to the front of the processor 15 and with gray room access to the maintenance section and the instrumentation and control section rearward of the work space 20. Such gray rooms require fewer precautions against contamination than clean rooms and, as such, they are less costly to build and maintain. The foregoing configuration thus reduces plant costs while allowing ready access to portions of the process system 10 more typically needing maintenance.

A front control panel 22 is disposed proximate the interface section 14 and allows operator control. The control panel 22 is preferably a touch screen cathode ray tube control display allowing finger contact to the display screen to effect various control functions. A secondary control panel may be included in the control section and accessed from the gray room so that operation can be effected from either front or back of the machine. All user programmable control functions and options are preferably displayed upon the control panel to effect operation and set up of the processing system 10 by a user.

Semiconductor wafers 50 are supplied to and removed from the enclosed work space 20 of processing system 10 through interface section 14. The wafers are supplied to the interface section in industry standard wafer containers or pods 51. The wafer containers are available from various manufacturers such as Empak, which sells a wafer container under the trademark CAPSIL.

Figure 5A:
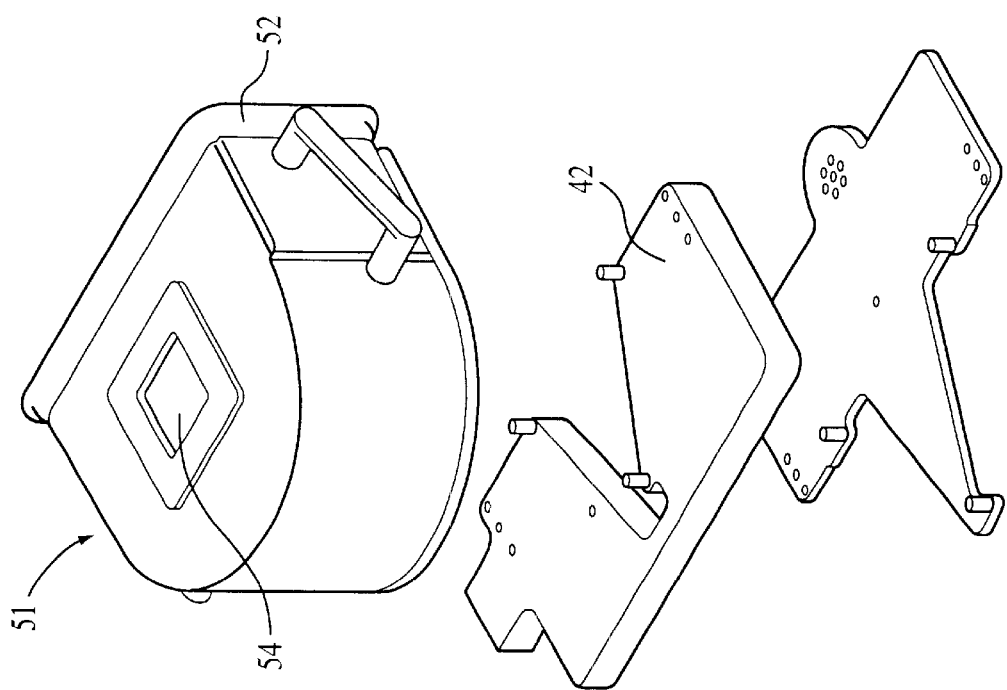
FIG. 5a is a perspective view of a wafer container in conjunction with the load plate and the elevator plate of the input/output subassembly.
Figure 5B:
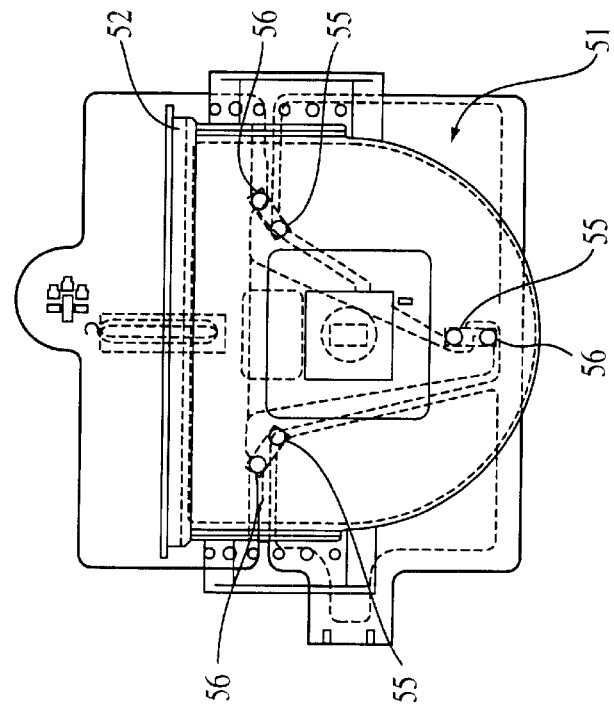
FIG. 5b is a top view illustrating the transfer of a wafer container from the elevator plate to the load plate.

As best illustrated in FIGS. 5a and 5b, the wafer container 51 has a cover 52 which, when removed, allows semiconductor wafers to be inserted into and removed from the wafer container. Typically, the cover 52 is translucent to allow visual detection and optical scanning of the wafers within the container 51. The wafer container 51 also includes a window 54 to permit viewing and optical scanning of the wafers. On the side opposite the window 54, the wafer container 51 is provided with features to facilitate handling of the wafer container 51 by automated equipment. These features include a set of inner circular slots 55, and a set of outer circular slots 56. The manner in which the disclosed embodiment of the processing system 10 interacts with these features will be explained in further detail hereafter. The wafer containers 51 are sealed and can be supplied with purge gas. The number of wafers positioned within the container 51 can vary, but at this time, the industry standard wafer containers typically have a capacity for 13 to 25 wafers having a diameter of 300 mm.

In the disclosed embodiment, the interface section 14 functions as both an input subassembly for receiving wafers to be processed, and an output subassembly for withdrawing processed wafers. Additionally, the interface section 14 can provide a holding or inventorying capability for both unprocessed and processed wafers. The interface section 14 includes an input/output subassembly, generally indicated by the numeral 30, which allows the wafer containers to be loaded into and removed from the processing system 10. The subassembly 30 is disposed in station 5 of the disclosed embodiment of the system 10.

The input/output subassembly includes an entry port, which is controllably opened and closed by the entry port door 32. The entry port door 32 may be pneumatically powered by an air cylinder 33 or the like to slide upwardly and downwardly on a guide track 34 to open and close the port. The components within the input/output subassembly 30 are preferably operated so that they will not move until the entry port door 32 is closed, thus enabling the port door to function as a safety mechanism for the operator.

When the entry port door 32 is opened, one or more wafer containers 51 may be loaded onto a loading elevator 40 within container access station 5. The loading elevator includes a container lift plate 42 which is adapted to receive a wafer container 51. In the disclosed embodiment, the container lift plate 42 is provided with coupling pins 44, which are mounted on the lift plate so that they are aligned and can be received within the respective inner slots 55 (FIG. 5b) provided on the industry standard wafer containers 51. As shown, the portion of the lift plate 42 between the coupling pins 24 is cut out, forming an almost pie-shaped cut-out 45. This cut-out portion 45 permits the wafer container 51 to be transferred to a loading plate 60, as will be described in further detail below. To assist with the positioning of the wafer container inner slots 55 onto the coupling pins 44 of the lift plate 42, the upper edge of the lift plate 42 is provided with at least one guide block 46. The lift plate 42 is carried on a guide track 47, and is raised to an overhead position and lowered to a loading/unloading position adjacent the entry port door 32 by operation of a pneumatic cylinder 48.

The loading elevator 40 allows the wafer containers to be loaded into the processing system in different ways. When the lift plate 42 is in its lower position adjacent the entry port door 32, the wafer container 51 can be loaded laterally onto the lift plate either via human loading or automated robot loading. When the lift plate 42 is raised to its overhead position, loading can be accomplished vertically through an access door disposed through the top of station 5 through use of an overhead transport system.

Figure 4:
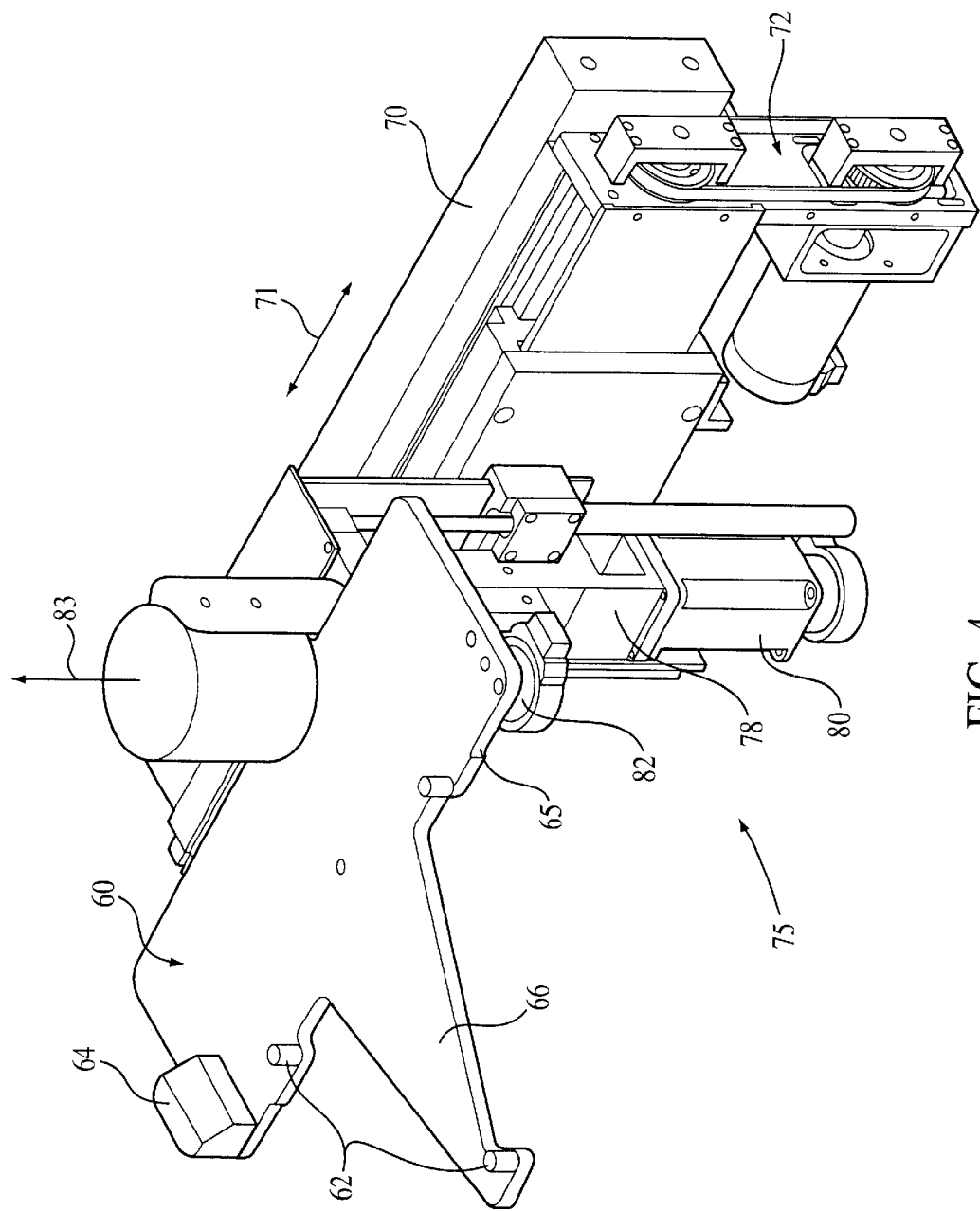
FIG. 4 is a perspective view of a load plate used in the input/output subassembly.

With the container lift plate 42 in its overhead position, a wafer container 51 can be loaded onto the loading plate 60 in the input/output subassembly. As show in FIG. 4, the loading plate 60 is provided with coupling pins 62, similar to the coupling pins 44 of the lift plate 42, except that the coupling pins 62 on the loading plate are aligned with and adapted to be received by the outer slots 56 (FIG. 5b) on the wafer container. The loading plate 42 also includes at least one mounting block 64 to assist in the positioning of the wafer container onto the loading plate. At its leading edge 65, the loading plate has a pie-shaped projection 66 that is slightly smaller than and complementary to the cut out portion 45 of the lifting plate. As best shown in FIG. 5b, the cut-out portion 45 allows the loading plate 60 to translate through the lift plate 42 to transfer a wafer container from the lift plate to the load plate, or vice versa, as described in further detail below.

The loading plate 60 is mounted on a guide track 70 for transverse horizontal movement in the direction of arrows 71 relative to the entry port door 32. The horizontal drive mechanism is preferably comprised of a motor drive and belt assembly 72, although other drive arrangements may be utilized. A second mounting and drive arrangement 75 mounts the loading plate 60 and includes various mounting arrangements and drive arrangements for moving the loading plate both vertically and rotationally about a vertical axis. The mounting and drive arrangement 75 include a drive arm 78 which is coupled via a mounting plate arrangement to the loading plate 60. The drive arm 78 is preferably driven vertically by a motor and lead screw drive arrangement 80 to raise and lower the loading plate 60. A motor and harmonic drive assembly 82 is coupled to the loading plate 60 to provide the rotational drive about a vertical axis 83. The motor and harmonic drive assembly 82 rotates the loading plate 90°, from a position in which the leading edge 65 of the loading plate is facing the entry port door 32, to a position in which the leading edge 65 is facing the container inventory subassembly 90 (see FIG. 1B). Each of the drive mechanisms preferably includes an incremental encoder to control the positioning of the loading plate 60 and an absolute encoder to determine the relative horizontal, vertical, and rotational position of the loading plate 60. The drive mechanisms operate in combination to position the loading plate 60 at the container inventory subassembly 90 (illustrated in FIG. 1B) to permit the wafer containers 51 to be transferred to and from the container inventory subassembly 90.

The loading plate 60 can either receive a wafer container 51 from an operator through the entry port, or can receive a wafer container that has been placed and temporarily stored on the lift plate 42 to facilitate both input and output operation of the container access station 5. In order to transfer the wafer container from the lift plate 42 to the loading plate 60, the lift plate 42 is lowered to its load/unload position, and the loading plate 60 is rotated so that its leading edge 65 is facing the entry port door 32. In this position, the loading plate 60 is below the lifting plate 42. The loading plate 60 may then be raised so that the pie-shaped projection 66 of the loading plate translates through the cut-out portion 45 of the lifting plate 42. As best shown in FIG. 5b, during this action, the coupling pins 62 on the loading plate engage the outer slots 56 on the wafer container 51, while the coupling pins 44 on the lifting plate are removed from the inner slots 55 on the wafer container, thus accomplishing a complete transfer of the wafer container 51 to the loading plate 60. The loading plate 60 can then be rotated 90° to transfer the wafer container 51 to the inventory subassembly 90.

Figure 6:
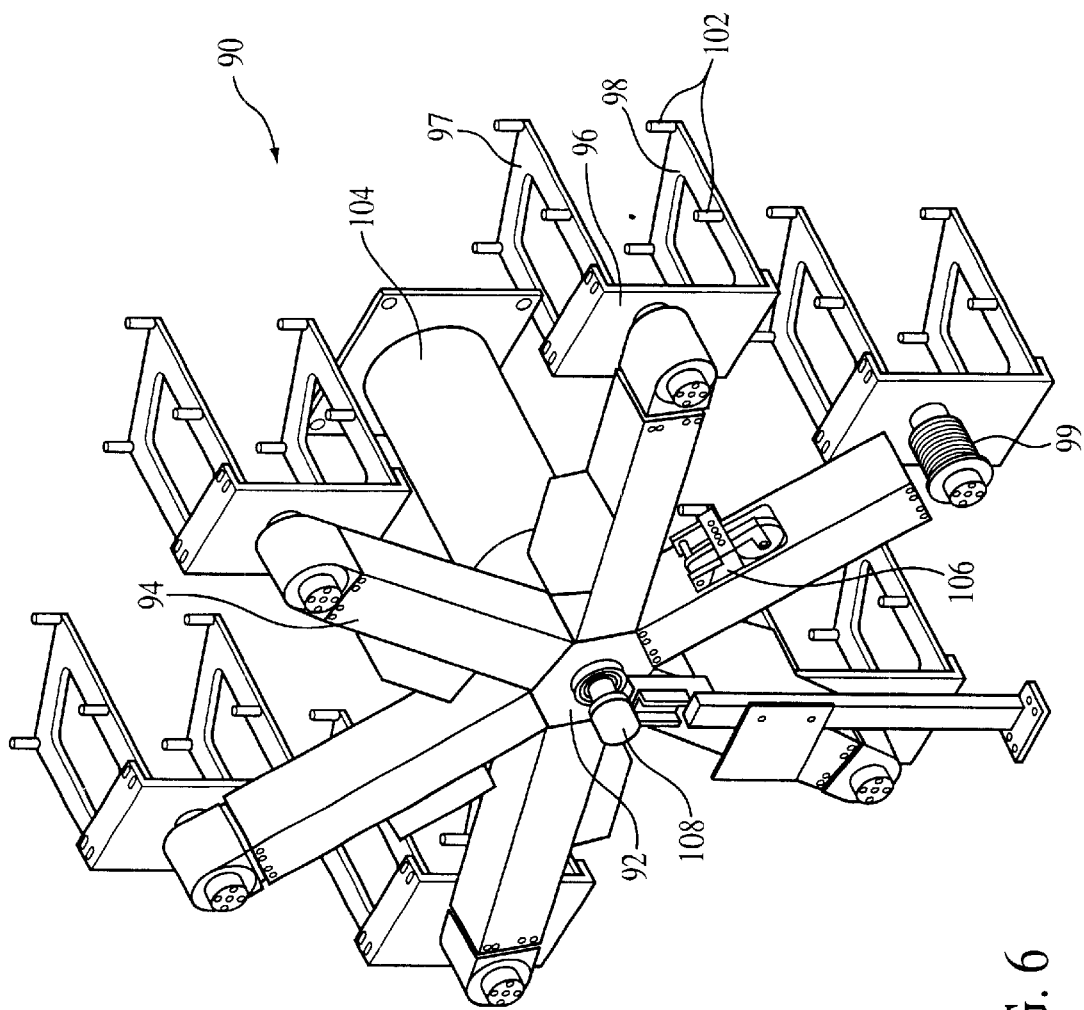
FIG. 6 is a perspective view of a preferred semiconductor inventory subassembly forming part of the processing system illustrated in FIG. 1.

Referring to FIG. 6, the inventory subassembly 90 includes a central horizontal hub 92 with a plurality of arms 94 radially extending therefrom. In the present embodiment, the number of arms is six, although other numbers of arms can be employed. Mounted on the end of each arm is a container carrier 96 having an upper and a lower shelf 97, 98, respectively. A bearing and timing shaft arrangement 99 mounts each container carrier 96 to an arm 94. The bearing and timing shaft arrangement 99 may be coupled with a timing belt to insure that the upper and lower shelves 97, 98 of each container carrier 96 always remain horizontal regardless of the relative position of the arms about the central hub 92. Mounted on each arm 94 is a tension pivot assembly 106 which functions to reduce any play in the timing system. The upper and lower shelves 97, 98 of each container carrier 96 include coupling pins 102 which are positioned on each shelf so that they are aligned with the inner slots 55 on the standard wafer container 51.

A drive arrangement in the form of an indexer 104 with twelve preset index positions rotates the arms 94 with their container carriers 96 around the axis of the hub 92 from a preset loading position adjacent the input/output subassembly to a preset container transfer position 180° opposite the loading position. An absolute encoder 108 is mounted on the central hub 92 to detect the relative positions of the arms 94.

In normal operation, each of the shelves will have a wafer container mounted thereon (twelve altogether) to facilitate the continuous processing of a full complement of wafers without interruption. The inventory subassembly 90 can, however, handle fewer than twelve wafer containers 51 depending on the batch processing requirements of the system user.

Detectors, such as, for example, optical sensors, can be mounted in fixed relationship with the frame 12 and positioned to optically scan the semiconductors wafers within the wafer containers as the containers are rotated about the central hub 92. Preferably, such detectors are placed at a location adjacent the interface between the input/output subassembly 30 and the container inventory subassembly 90, and at a location adjacent the interface between the container inventory subassembly 90 and a container docking subassembly 110. Such optical scanning allows the processing system 10 to keep track of all wafers as they are processed through the system.

In operation, the indexer 104 rotates the arms 94 until a shelf on one of the container carriers 96 reaches a preset loading position adjacent the input/output subassembly 30. A wafer container 51 may then be transferred from the loading plate 60 to the respective container shelf by moving the loading plate 60 until it is positioned above the shelf, rotating the loading plate until the inner slots 55 on the wafer container 51 are aligned with the coupling pins 102 on the shelf, and lowering the loading plate 60 so that the inner slots 55 are received by the coupling pins 102. The loading plate 60 may then be rotated slightly to clear it from the shelf and then withdrawn. To unload the wafer container 51 from the inventory subassembly 90 for processing, the arm and the container shelf holding the wafer container 51 can be rotated 180° about the hub so that the wafer container can be accessed by the container docking subassembly 110 disposed in the container docking station 6.

As best illustrated in FIG. 2, the container docking subassembly 110 includes a robotic conveyor 111 comprising a robotic arm 112 mounted on a carriage 114 for linear movement along a guided track 115. The robotic arm 112 of the disclosed embodiment has three jointed segments—a lower or first segment 116 mounted to the carriage 114, a middle or second segment 117 linked to the first segment via a timing belt arrangement or the like, and an upper or third segment 118 linked to the second segment. This robotic arm construction enables the arm to move up, down and back and forth while occupying a minimum amount of space. The third segment 118 has a horseshoe shaped appearance and permits the robotic arm to lift and separate the wafer container 51 from a container shelf within the container inventory subassembly 90. Coupling pins 122 positioned on the third segment are adapted so that they may contact and be received within the outer set of slots 56 on the wafer container 51 to complete the transfer to the robotic arm 112.

Figure 7:
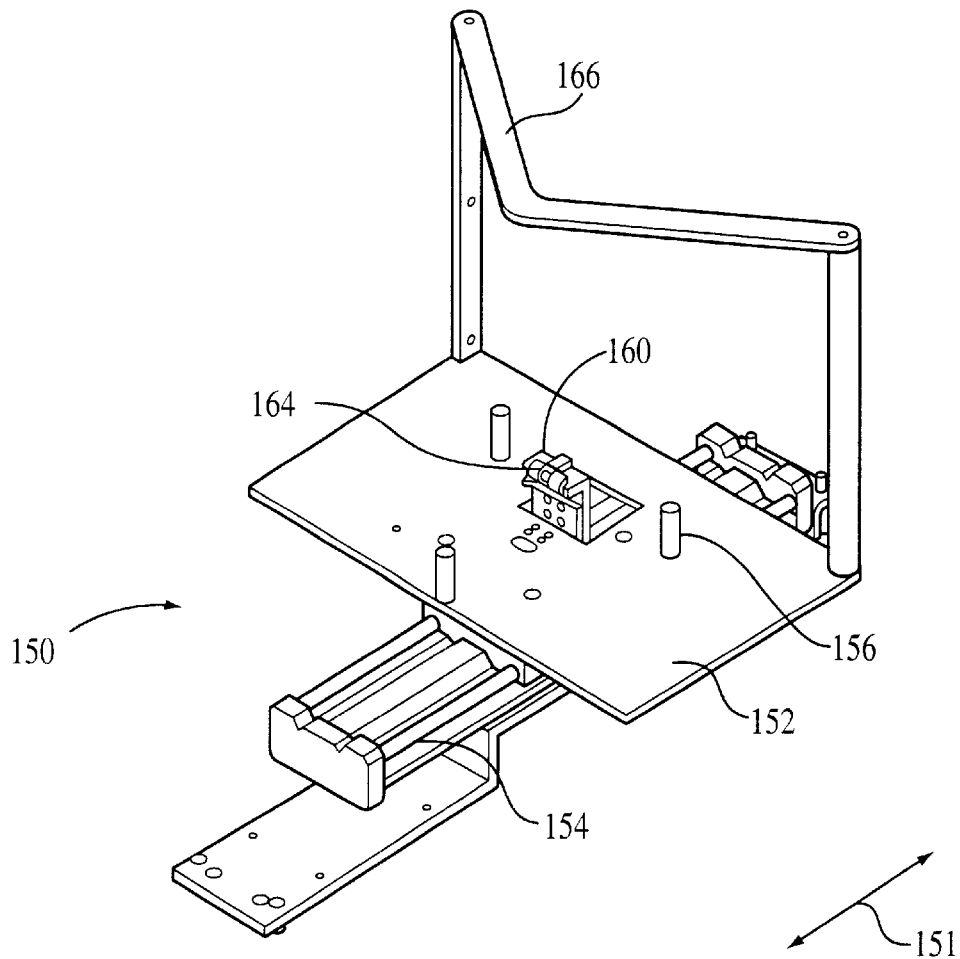
FIG. 7 is a perspective view of a container transfer forming part of the docking assembly of the processing system illustrated in FIG. 1.

The carriage 114, together with the robotic arm 112, slide along the guided track 115 to a position adjacent to a container transfer subassembly, generally indicated at numeral 150. As illustrated in FIG. 7, the container transfer subassembly includes a docking plate 152 mounted on a linear slide 154 for movement in the direction of arrows 151. Coupling pins 156 are positioned on the docking plate 152 so as to align with the inner slots 55 on the wafer container 51. The docking plate 152 also includes an aperture 158 for receiving a latch hook 160 which is sized and adapted to latch into a groove or the like located on the door of the wafer container 51. The latch hook 160 may be mounted on a pneumatic slide which permits the latch hook to move towards and away from the wafer container 51 to latch and unlatch the wafer container 51. Roller guides 164 are provided on the latch hook 160 to facilitate contact and engagement of the latch hook with the wafer container. An overhead frame 166, mounted to the docking plate 152, houses sensors for detecting the presence of wafers within the wafer container. Another sensor, such as a fiber optic cable, may be used to detect the presence of a wafer container on the docking plate.

Figure 8A:
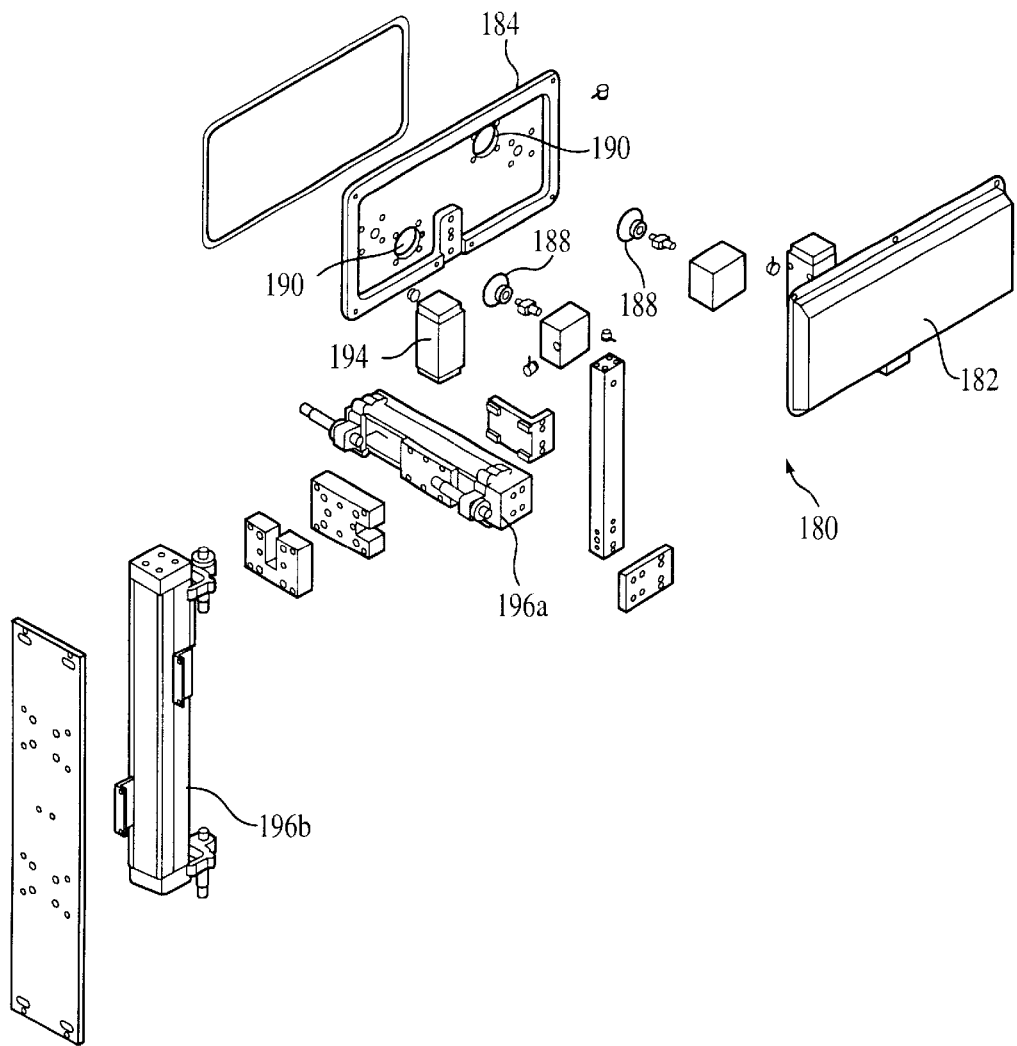
FIGS. 8A and 8B are a perspective view of a hatch interface forming part of the docking subassembly of the processing system illustrated in FIG. 1.
Figure 8B:
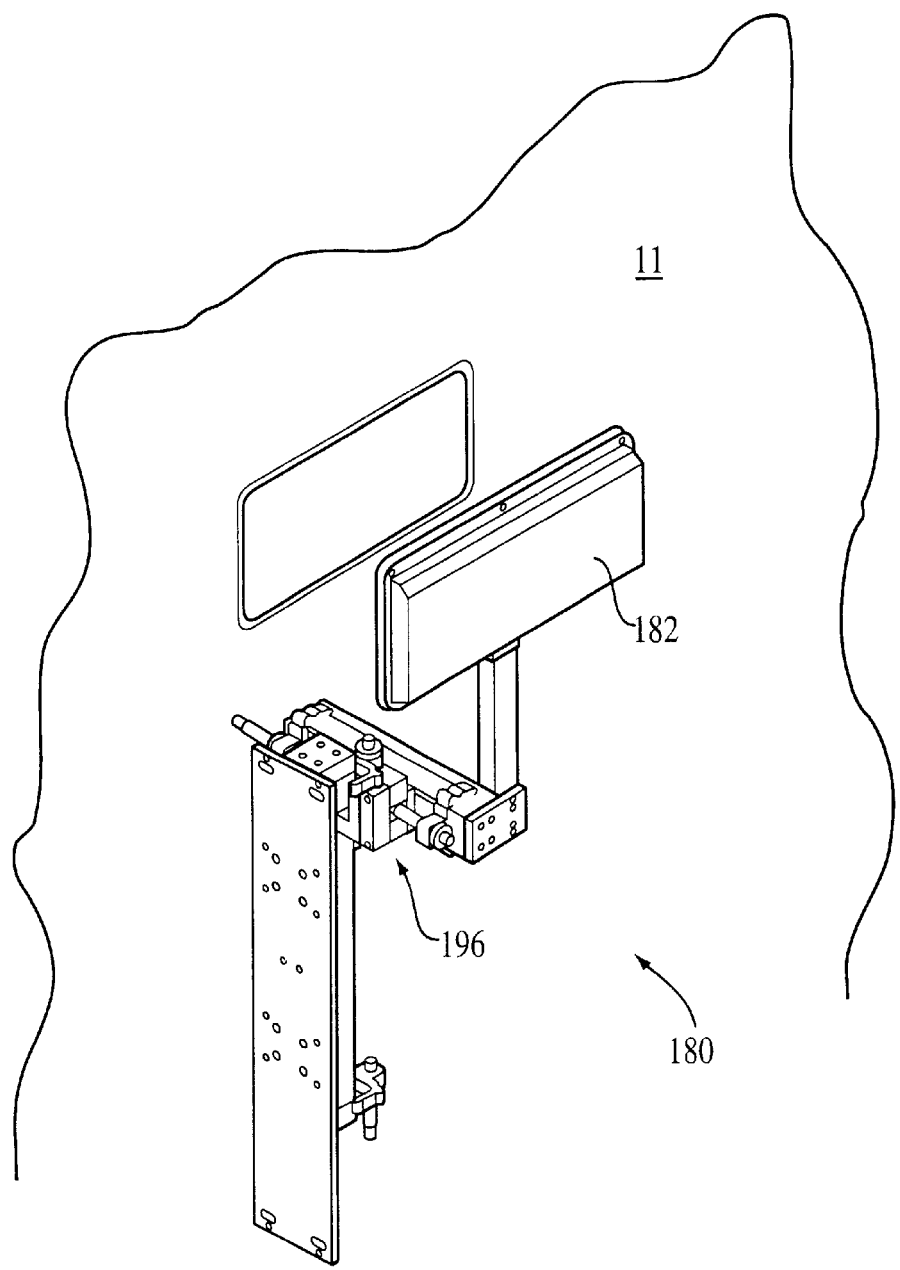

The linear slide arrangement 154 slides the docking plate 152 into a position adjacent a hatch interface, generally indicated by numeral 180 in FIGS. 1B, 8A and 8B. The hatch interface 180 is disposed in the wafer transfer station 8. Referring now to FIGS. 8A and 8B, the hatch interface 180 includes a hatch cover 182 which supports an interface plate 184 that is sized and adapted for sealing engagement with the door of the wafer container 51. The interface plate supports a perimeter seal 186 which seals the interface plate 184 with the wafer container door.

Vacuum cups 188 fit through apertures 190 in the interface plate to make vacuum sealing contact with the wafer container door and secure the door to the interface plate. T-shaped locking keys also extend through apertures in the interface plate and insert into receptors in the wafer container door. A rotary actuator 194 turns the locking keys to lock the wafer container door into sealing engagement with the interface plate. In the event of a loss of vacuum through the vacuum cups 188, the T-shaped keys help to retain the container door against the interface plate 184. The hatch cover 182 and interface plate 184 are mounted to a pneumatic cylinder assembly 196, comprised of cylinder assemblies 196a and 196b, which allow the hatch cover and interface plate to slide forward and backward, and up and down, relative to the wafer container.

In operation, vacuum is applied to the vacuum cups 188 so that the container door is held in vacuum sealing relationship with the interface plate 184. The vacuum seal traps any contaminants that might be on the container door and prevents them from entering into the processing section. The actuator 194 turns the keys to lock the container door to the interface plate. The pneumatic cylinder assembly 196a slides the interface plate 184 and hatch cover 182 backwards (i.e. away from the container), causing the container door to move with the interface plate. This opens the container and exposes the interior of the container to the clean environment of the processing section. The pneumatic cylinder assemblies 196a and 196b then cooperate together to slide the interface plate 184 and the hatch cover 182, together with the container door, downward, and then forward (i.e. toward the container) to move the door out of the way for handling and processing of the wafers.

In a preferred embodiment, the processing system is provided with two container transfer subassemblies 150, and two hatch interfaces 180, as generally illustrated in FIG. 2, that are disposed within and proximate to the container docking station 7. This allows one container transfer subassembly 150 to handle wafer containers 51 holding unprocessed wafers, while the other subassembly 150 handles containers 51 holding processed wafers, thus permitting efficient handling of the wafers.

Figure 9B:
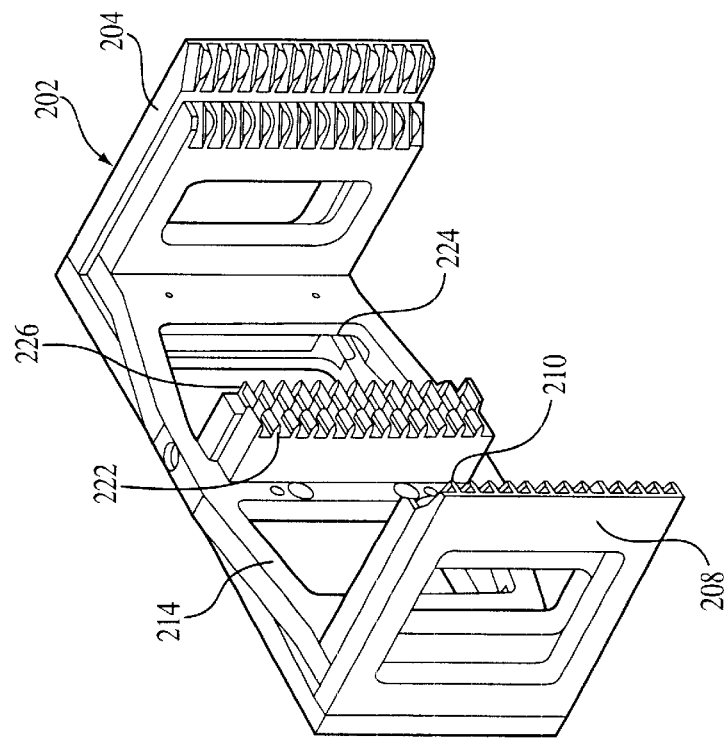
Figure 9A:
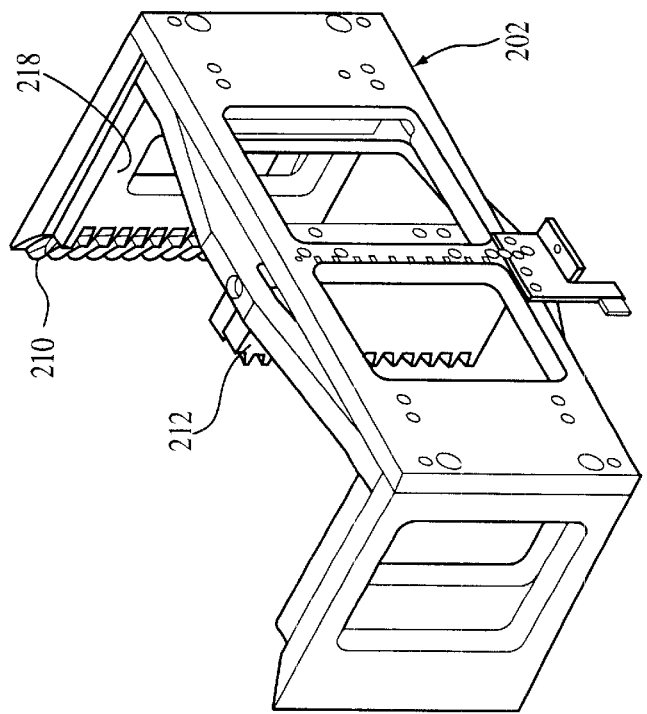
FIG. 9a is a front perspective view of a wafer transfer comb forming part of the transfer subassembly of the processing system illustrated in FIG. 1.
Figure 10:
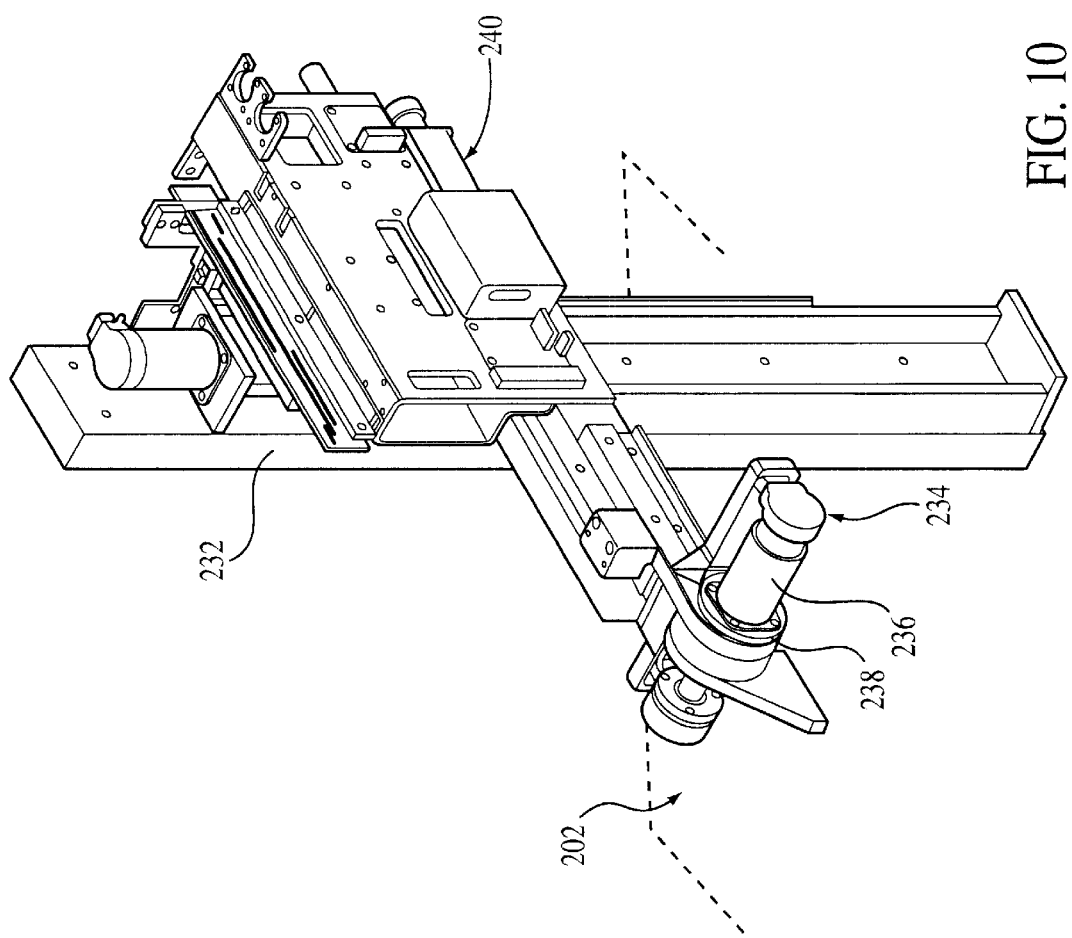
FIG. 10 is a perspective view of the conveyor for the wafer comb illustrated in FIGS. 9a and b.

The wafers are removed from the container 51 by a wafer transfer subassembly 200 disposed in the wafer transfer station 9. The wafer transfer subassembly 200 includes a wafer comb 202 (see FIGS. 9a and 9b) mounted on a carriage assembly 230 (see FIG. 10). Referring now to FIGS. 9a and 9b, the wafer comb 202 comprises an outer comb frame 204 having outwardly extending engagement arms 208, each of which carries a set of teeth 210 at the outer end thereof. The middle portion of the outer comb frame also carries a middle set of teeth 212. A complementary-shaped inner comb frame 214 has an outer set of teeth 220 mounted on the outer ends of each of its engagement arms 218 and a middle set of teeth 222 mounted on the middle portion of the frame. The inner comb frame is positioned adjacent the outer comb frame such that the middle set of teeth 212 on the outer comb frame extend through an opening 224 in the inner comb frame, and the outer and middle sets of teeth 220, 222, respectively on the inner comb frame are adjacent the corresponding sets of teeth on the outer comb frame.

The outer comb frame 204 is slideable vertically with respect to the inner comb frame 214. The inner comb frame 214 is in fixed positional alignment with the carriage assembly 230. When the outer comb frame is in its lowest position, the teeth on the outer comb frame are aligned with the teeth on the inner comb frame in an "open" wafer comb position. In this position, the wafer comb 202 can be inserted into the open wafer container until the teeth of the wafer comb are interleaved with the wafers in the container. The wafers are held within the wafer comb by slightly lifting the outer comb frame 204 to the "closed" wafer comb position illustrated in FIGS. 9a and 9b. Various mechanisms, such as a lead screw driven by a stepper motor, can be used to actuate lifting of the outer comb frame 204. In this closed position, the teeth on the outer comb frame are offset with respect to the teeth on the inner comb frame, causing the wafers to be cantilevered on the outer comb frame teeth. The wafer comb is designed such that the individual teeth are canted down at a slight angle from horizontal, such as a 10 mm pitch, to insure that the wafers remain positioned within the wafer comb.

To insure proper positioning of the wafers within the wafer comb, it may be desirable to provide the wafer comb with sensors. In one embodiment, sensors 226 are provided at each tooth of the middle set of teeth 212 on the outer comb frame 204.

The carriage assembly 230 which mounts the wafer comb 202 is itself mounted on a guide track 232 for linear movement toward and away from the open wafer container 51. The carriage assembly 230 includes a rotary drive mechanism 234, such as a rotary motor 236 and harmonic drive 238, for rotating the wafer comb 90° about a horizontal axis, from a horizontal position, to a vertical position, best shown in FIG. 2. The carriage assembly 230 also includes a vertical drive mechanism 240 for lifting the wafer comb so that the wafer comb can deposit the wafers onto a wafer support in the form of a wafer bunching comb 250 (see FIG. 2).

Figure 11A:
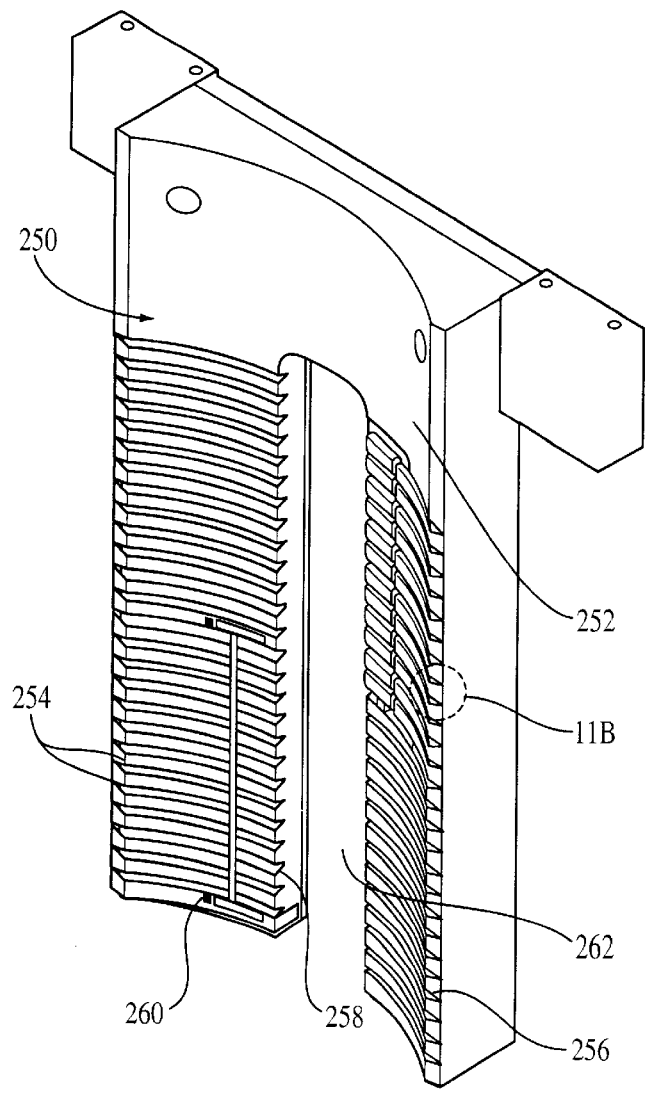
FIG. 11A is a perspective view of a wafer bunching comb forming part of the processing system illustrated in FIG. 1.
Figure 11B:
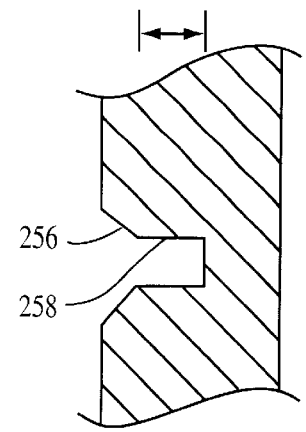
FIG. 11B is a cross-sectional view illustrating a groove of the comb of FIG. 1A.

Referring to FIGS. 11A and B, the wafer bunching comb 250 has an upper surface 252 on which is provided a series of wafer-receiving grooves 254. Each of the grooves has downwardly converging receiver sides 256 which adjoin a relatively narrow slot section 258. The slot section has substantially parallel side walls and is sized to provide a width about 0–10% greater than the thickness of the wafers being received therein. The receiver sides help to insure proper insertion of the wafers within the grooves while minimizing contact with the wafer surface. The upper surface 252 and the slot sections therein are dimensioned to form an arc that generally corresponds to a segment of the diameter of the wafer. The particular number of grooves in the wafer bunching comb may vary. Typically there will be 26 to 50 grooves in order to correspond with the capacity of two of the associated wafer containers being used, so that the wafers from two wafer containers can be processed at once. Sensors 260 are provided on the upper surface 252 to detect the proper positioning of the wafers within the grooves.

The wafer bunching comb 250 has a longitudinal slot 262 that is sized to permit the vertical drive assembly 240 (see FIG. 10) of the wafer comb to pass therethrough. The vertical drive assembly 240 can lift the wafer comb until it is slightly higher than the wafer bunching comb 250, and the horizontal drive assembly can linearly move the wafer comb until the vertical drive assembly is positioned within the longitudinal slot and the wafers are aligned with the grooves in the wafer bunching comb 250. The wafers can then be lowered in a controlled fashion into the grooves in the wafer bunching comb.

Once the wafers are in place in the wafer bunching comb 250, the docking assembly steps can be reversed so that the container door can be replaced onto the wafer container, the wafer container can then be retracted from the interface plate, and placed back onto a wafer container shelf of the inventory subassembly. The entire docking and wafer transfer processes can then be repeated so that the wafers from two wafer containers are positioned on the wafer bunching comb 250.

Figure 1C:
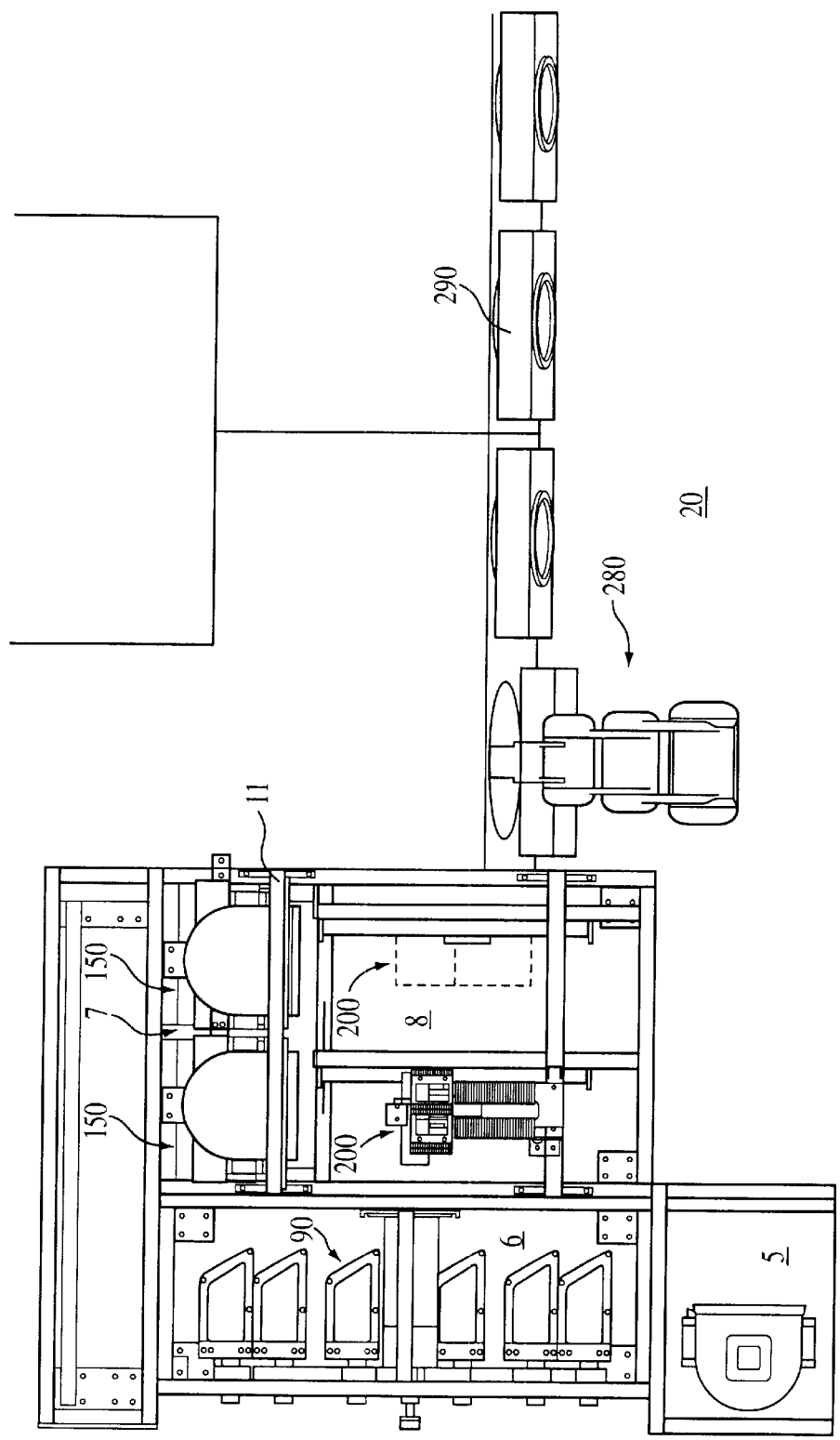
FIG. 1C is a top view of the semiconductor processing system of FIG. 1A illustrating flow of semiconductor wafers therethrough.

FIGS. 1B, 1C, and 2 show a robotic conveyor, generally indicated by the numeral 280, for conveying the wafers within the processing system, specifically between, to and from the bunching comb 250 and one or more processing stations, such as processing stations 290. The robotic conveyor 280 includes a mounting beam or rail 282 upon which a movable conveyor robot subassembly 284 is mounted and moves relative to the rail.

The robotic device can be of various designs. In one design, the robotic conveyor comprises an articulated arm having an upper arm portion 285, a lower arm portion 286, and a hand portion 287. Mounted to the hand portion is an engagement tool 288 for engaging the semiconductor wafers and delivering them to various individual or plural work stations. Further details of suitable conveyor devices and other aspects of the processing system are described in U.S. Pat. No. 5,544,421, issued Aug. 13, 1996; U.S. Pat. No. 5,660,517 issued Aug. 26, 1997; and U.S. Pat. No. 5,664, 337, issued Sep. 9, 1997, each of which is herein incorporated by reference.

FIG. 1C illustrates flow of semiconductor wafers as they are processed by the processor 10. As illustrated, the pods 51 are first place in the insertion station 5. The components of the insertion station 5 rotate the pod 51 and place it on the inventory subassembly 90 of the inventory station 6 where they remain until such time as the wafers contained therein are to be processed. When the wafers of a pod 51 are to be processed, the respective pod 51 is removed from the inventory subassembly 90 by one of the docking subassemblies 150. The docking subassembly 150 transports the pod to the hatch interface where the wafers are removed from the pod without being exposed to the ambient atmospheric conditions of the interface section. Rather, the wafers are only exposed to the clean environment of the workspace area 20. After extraction, the wafers are presented to the wafer conveying system 280 which transports them for processing in the appropriate processing station(s) 290. After removal from the processing station(s), the wafers are returned to the same or different pod and the pod is sealed without exposing the wafers to the ambient atmospheric conditions of the interface section. The respective docking subassembly 150 then returns the pod containing the processed wafers to the inventory subassembly 90 where the pod is stored until such a time as the wafers therein are to undergo further processing within the work space 20 or until they are removed through station 5 by an operator as directed, for example, through control panel 22.

The processing section of the processing system includes at least one and preferably a plurality of individual processing stations 290 which can be of various construction. Further details with respect to suitable processions stations, and more specific explanation about the loading (installing) and unloading of the wafers into the processing stations are described in U.S. Pat. No. 5,664,337, issued Sep. 9, 1997, which is herein incorporated by reference.

Referring to FIGS. 12 through 15, each processing station 290 includes a processing vessel 292 which partially encloses a processing bowl. The processing vessel also mates with a movable door 512 which can be moved between the closed position shown in FIG. 12, and a retracted position shown in phantom outline. The disclosed embodiment of the processing system 10 includes an improved door assembly 500 for the processing vessel.

Figure 12:
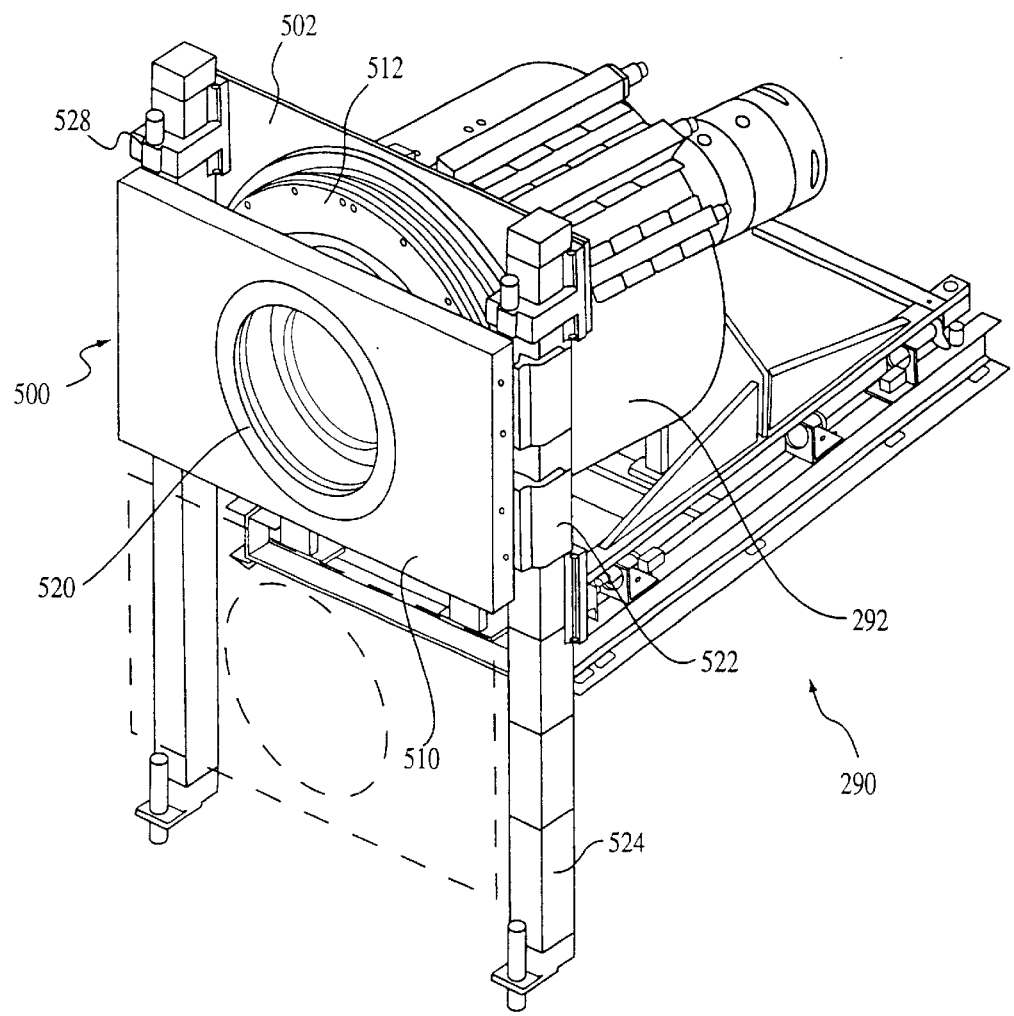
FIG. 12 is a perspective view of a semiconductor processor forming a part of the processing system illustrated in FIG. 1 and employing a novel door actuation and sealing mechanism.
Figure 13:
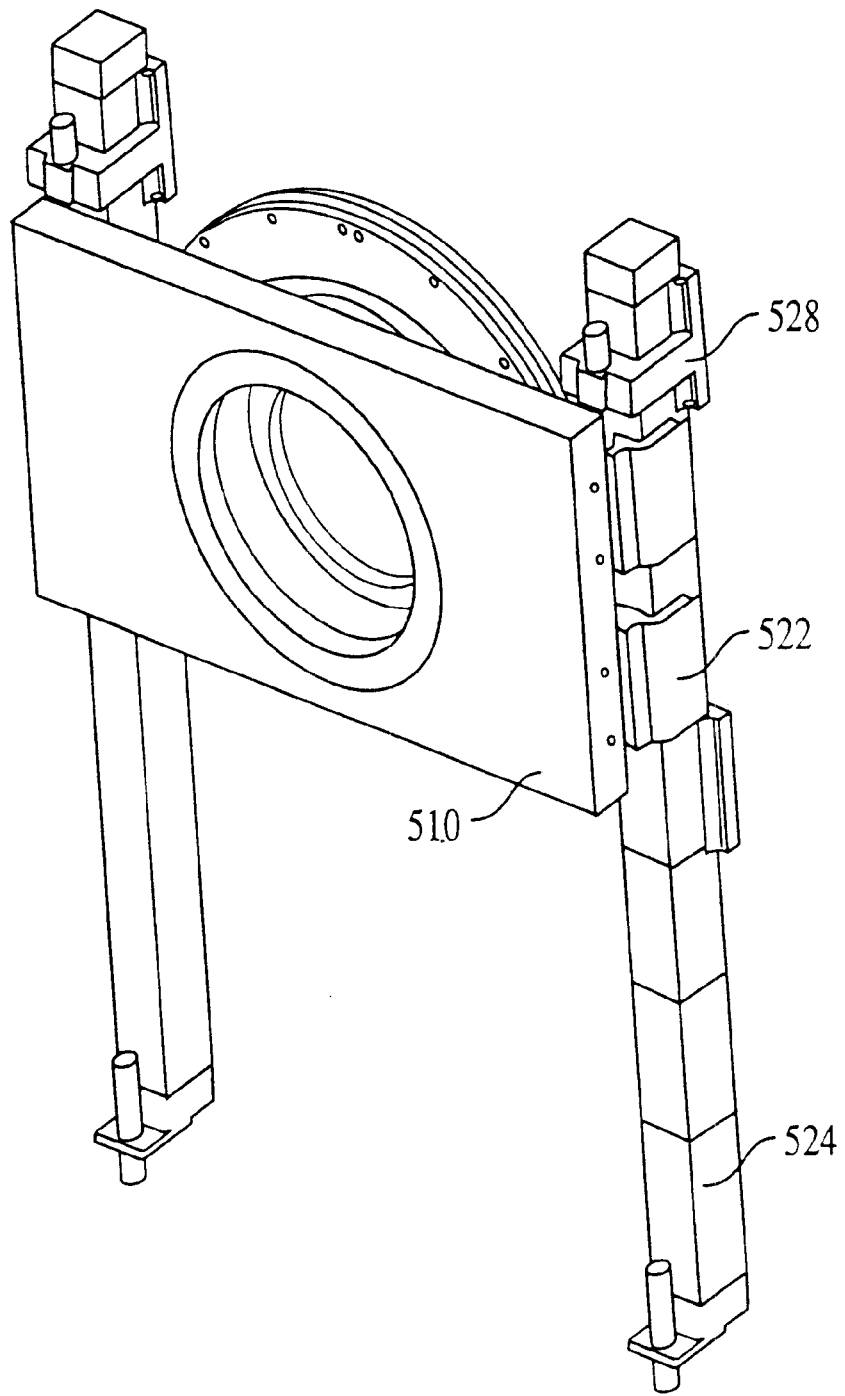
FIG. 13 is a perspective view of the processor door actuation assembly.

Referring to FIGS. 12 and 13, the door assembly 500 is in fixed positional alignment with a front wall 502 of a processing vessel. The front wall 502 is provided with an access opening, defined here by a circular opening 506 of the front wall (best illustrated in FIG. 15). When the front wall 502 is mounted to the remaining portions of the processor, the opening periphery 506 is positioned to be in alignment with an access opening 507 (See FIG. 15) formed in the front wall of the processor bowl 294.

The do or assembly 500 further includes a door support plate 510 which mounts a door 512 and a door extension and retraction operator 514. The door 512 includes a stiffening plate 504 and a viewing window 508 that permits visual inspection of the processing chamber defined by the bowl 294. The door extension and retraction operator 514 of the disclosed embodiment includes a stationary outer cylinder 516 coupled to the door support plate 510, and an operative extension part 518. The operative extension part 518 is concentrically positioned inside of the outer cylinder 516 for controllable extension and retraction relative to the outer cylinder. Additional features and the operation of the door extension and retraction operator 514 are discussed in greater detail below.

The door support plate 510 includes a viewing aperture 520 for providing visibility through the window 506 into the processing chamber contained within the bowl 294 of the processor. The door support plate 510 is coupled on each side to slideable guide brackets 522 using, for example, conventional fasteners. Each slideable guide bracket 522 is slideably mounted to a respective pneumatic band cylinder 524. The band cylinders 524 are connected to the front wall 502 of the processing vessel via mounting plates 528. The combination of the guide brackets 522, the band cylinders 524, and the mounting plates 528 provides a simplified and rigid door mounting construction that needs no additional guides or support blocks. The guide brackets 522 are mounted for substantially vertical movement so that the door assembly can be moved between an open or fully displaced position to allow access into the bowl of the processor, and a closed position wherein the door assembly is in substantially concentric alignment with the access opening. In the closed position, the door can be extended into the access opening and sealed against the bowl of the processor.

Figure 14:
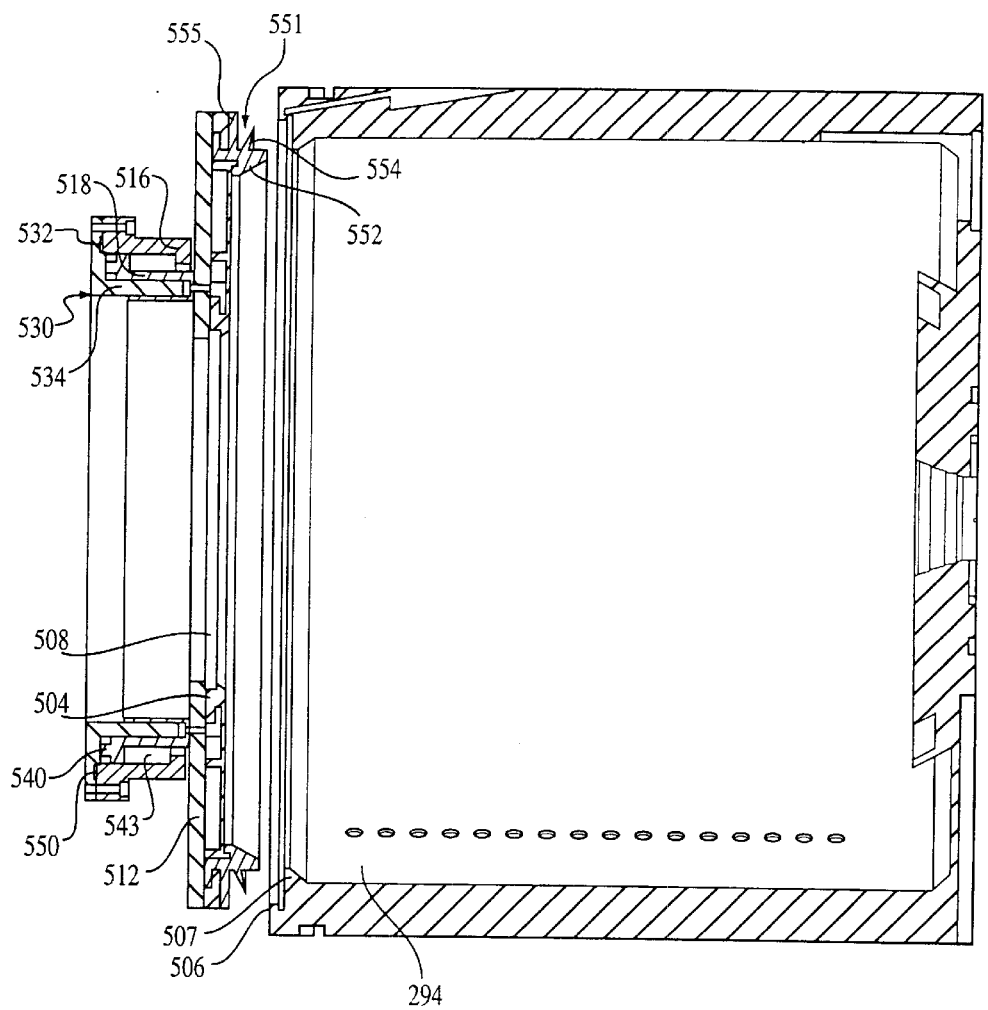
FIG. 14 is a cross-sectional side view of the processor door in an open position.
Figure 15:
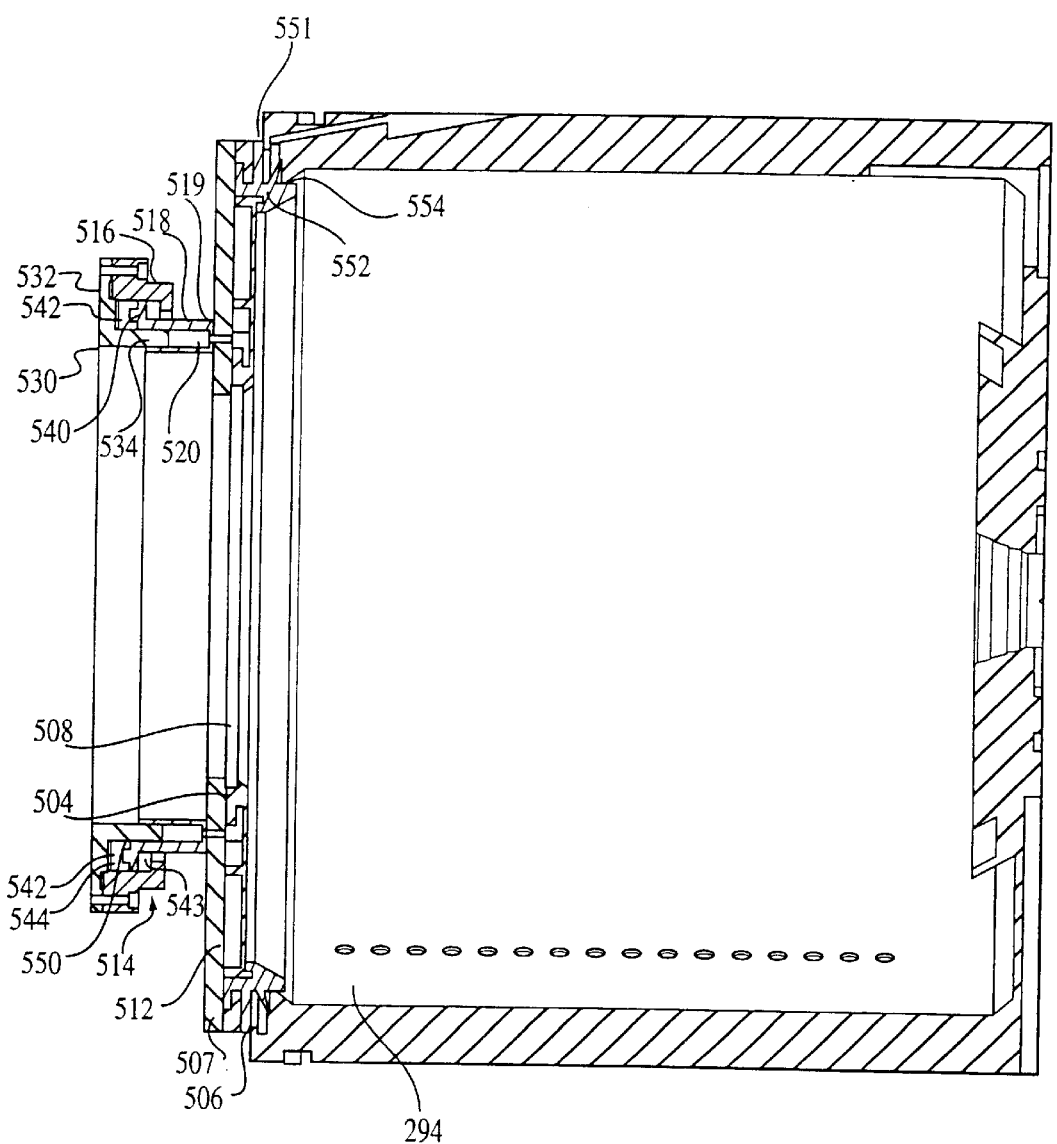
FIG. 15 is a cross-sectional side view of the processor door in a closed position.

Referring to FIGS. 14 and 15, which show sectional views of the door assembly 500, the movement of the extension part 518 relative to the outer cylinder 516 is explained in greater detail. To this end, an annular inner stationary cylinder 530 has an annular flange portion 532 and an axially extending ring portion 534. The annular flange portion 532 is securely mounted on its outer side upon the door support plate 510. At the point of mounting, the annular flange portion is bounded on its opposite side by the outer cylinder 516. A plurality of fasteners secure the outer cylinder 516 and the annular flange portion 532 to the mounting plate 510.

The extension part 518 is concentrically positioned between the inner cylinder ring 530 and the outer cylinder 516, and includes a U-shaped portion 519 that defines an annular guide receptacle 520. As illustrated in FIG. 14, the axially extending ring portion 534 fits within the annular guide receptacle 520. The extension part 518 also includes an annular piston portion 540. The annular piston portion 540 rides within an annular piston operation chamber 542 defined by the ring portion 534 and the outer cylinder 516.

The piston 540 bifurcates the piston operation chamber 542 into two operative compartments: a retraction chamber compartment 543 and an extension chamber compartment 544. Each piston chamber compartment is adapted to hold pneumatic or hydraulic fluid. Multiple annular seals 550 are positioned about the piston 540 and the extension part 518 to seal separate fluid within the chambers 543 and 544.

Separate fluid supply conduits are preferably provided to the retraction chamber 543 and the extension chamber 544 to increase or decrease fluid pressure within the respective chambers and effectuate movement of the piston. As shown in FIG. 15, when hydraulic fluid is supplied under an increased pressure to the extension chamber 544, a pressure differential is created on the piston 540 which will cause the extension part 518 to extend away from the door support plate. Movement of the extension part 518 and the integral piston 540 into the extended position shown in FIG. 15 moves the door into sealing engagement with the access opening 506 formed in the front wall 502 of the processor bowl, thereby closing the semiconductor processor. Mounted on the periphery of the door 512 is an annular door seal 551. Preferably, the door seal is formed of Teflon using known machining techniques. The door seal includes an axially extending shroud portion 552 and an annular tongue portion 554. When the door is in the closed position shown in FIG. 15, the shroud portion 552 of the door seal lies in a plane that is within the front wall of the processor, and the tongue portion presses in sealing engagement against the outside rim of the processor bowl, thereby effectuating a seal between the door and the processor bowl. The door seal also preferably includes a flange portion 555 which acts as a stop for the door seal.

The combination of the piston 540 and the door seal 550 provides a highly reliable and effective door closing and sealing mechanism. Movement of the piston allows the extension part to move the door outwardly from the support plate equidistantly at all times without the need for peripheral adjustments to ensure equidistant movement. By seating against the outside rim of the processor bowl, the tongue portion provides an effective fluid tight seal and automatically compensates for any misalignment between the door and the processor.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A system for processing articles stored in a container, comprising:
   an interface section and a processing section with an enclosure and separated by a wall
   with the interface section including:
      an entry port;
      an inventory station having a plurality of positions for holding the article containers;
      an input/output subassembly positioned for loading article containers between the entry port and the inventory station; and
      a container docking subassembly having a container transfer mechanism to carry a container from the inventory station to a hatch opening in the wall separating the interface section and the processing section;
   and with the processing section including:
      an extractor extendable from the processing section, through the hatch opening and into an article container in the interface section positioned at the hatch opening, to move an article out of the article container and into the processing section, or to move an article from the processing section into an article container;
      at least one processing station in the processing section; and
      a robot conveyor movable between the extractor and the at least one processing station, for carrying articles between them.

2. The system of claim 1 further comprising a hatch cover actuator assembly in the processing section and including a first actuator for moving a hatch cover linearly towards and away from the hatch opening in the wall, and a second actuator for moving the hatch cover vertically.

3. The system of claim 2 further comprising an interface plate attached to the hatch cover, and a key and a container door holder extending outwardly from the interface plate, to engage and hold a container door.

4. The system of claim 1 further including a seal between the container and the wall.

5. The system of claim 1 wherein the extractor comprises a comb mounted on a carriage assembly.

6. The system of claim 5 with the extractor further comprising a vertical drive for lifting and lowering an article between raised and lowered positions.

7. The system of claim 5 wherein the carriage assembly is mounted on a guide track for linear movement towards and away from the opening in the wall.

8. The system of claim 1 further comprising a bunching comb in the processing section, for accumulating articles moved on to the bunching comb by the extractor.

9. The system of claim 1 wherein the extractor comprises a first comb, and second comb within the first comb, and a comb driver for moving the first and second combs relative to each other.

10. The system of claim 8 wherein the second comb is attached to a carriage assembly, and with a first set of teeth on the first comb and a second set of teeth on the second comb, the first comb movable by the comb driver from a first position, where the first and second sets of teeth are aligned with each other, to a second position, where the first and second sets of teeth are at least partly offset from each other.

11. The system of claim 1 where the extractor includes an engagement arm, and a first actuator attached to the engagement arm for moving the engagement arm to move articles into and out of the container, and the extractor further including a second actuator for rotating the engagement arm, to move articles between a horizontal position and a vertical position.

12. The system of claim 1 wherein the container transfer mechanism comprises a robotic arm mounted on a carriage for linear movement along a guide track extending between the inventory station and the docking station.

13. The system of claim 1 further including a loading elevator adjacent to the entry port for lifting and lowering a container between the entry port and the inventory section.

14. The system of claim 13 further including a removable door on the container, and a drive mechanism for turning the container, so that the orientation of the container door opening at the entry port is different from the orientation of the container door opening when the container is at the hatch opening.

15. An apparatus for processing articles stored in a container, comprising:
   an interface section and a processing section adjoining the interface section; the interface section including:
      an entry port having an entry port door moveable between an open position and a closed position;
      an inventory station having an inventory subassembly for moving the article containers in a longitudinal direction through the inventory station;
      an input/output subassembly positioned for moving the article containers between the entry port and the inventory station; and
      a container transfer device movable in a lateral direction, perpendicular to the longitudinal direction, to carry a container from the inventory station to a docking station;
   and with the processing section including
      an extractor movable in the longitudinal direction into a container at the docking station, to move articles into or out of the container;
      a plurality of processing stations laterally aligned in the processing section; and a robot conveyor movable in the lateral direction in the processing section, to carry articles to and from the processing stations.

16. The system of claim 15 with the extractor further including a rotary drive for pivoting the article upwardly, from a horizontal position, to a vertical position.

17. The system of claim 15 wherein the container transfer device and the robot conveyor move in directions parallel to each other, and the extractor moves in a direction perpendicular thereto.

18. The system of claim 15 wherein the interface section is sealed off from the processing section, except at a door opening in a wall separating them.

19. The system of claim 18 wherein the door opening in the wall is larger than the container door, and further including a hatch interface for moving the container door through the door opening in the wall and into the processing section.

20. The system of claim 19 with the hatch interface including a longitudinal actuator attached to a hatch cover, for moving the hatch cover towards and away from the wall, and a vertical actuator supporting the longitudinal actuator, for moving the hatch cover vertically.

21. The system of claim 15 wherein the extractor includes a carriage on a guide track extending perpendicular to the robot conveyor rail with the guide track vertically movable along a vertical drive column, a rotary drive on the carriage, and a comb assembly attached to the rotary drive.

22. A system for processing articles stored in a container, comprising:
an interface section and a processing section within an enclosures a wall separating the interface section from the processing section, with the wall having first and second hatch openings, to allow articles to be moved between the interface section and the processing section;
the interface section including:
an entry port in the enclosure; an inventory station having a plurality of positions for holding the article containers; an input/output subassembly positioned for loading article containers between the entry port and the inventory station; and first and second container transfer subassemblies, to carry containers from the inventory station to the first and second hatch openings;
and with the processing section including:
first and second hatch covers attached to first and second hatch cover actuator assemblies, respectively, with the first and second hatch covers moveable towards and away the wall, to close off and open up the first and second hatch openings, respectively; at least one extractor extendable from the processing section through at least one of the first and second hatch openings, and into a container in the interface section, to move an article out of the container and into the processing section, or to move an article from the processing section into the container; at least one processing station in the processing section; and a robot conveyor movable between the at least one extractor and the at least one processing station, for carrying articles between them.

23. A processor for processing articles provided in sealed containers, comprising:
a processing section and an interface section wherein the interface section is adjacent to but isolated from the processing section by a barrier having a closeable passageway therethrough;
the processing section comprising: (a) an enclosure defining a workspace, the workspace being communicable with the interface section through the passageway; (b) at least one processing station adjacent the workspace, (c) an article transfer station in the workspace; and (d) an article conveyor in the workspace for conveying articles between a processing station and the article transfer station; and
the interface section comprising: (a) a container docking station adjacent the passageway for docking an article container to the passageway, and (b) a container opener assembly associated with the container docking station to unseal an article container and open the passageway when the container is engaged and sealed to the passageway;
article transfer assembly in the article transfer station adapted to transfer articles through the passageway and between an article container and the transfer station when a container is engaged and sealed to the passageway.

24. An apparatus for processing articles stored in a container sealed via a door container, comprising:
an interface section and a processing section adjoining the interface section;
the interface section including:
an inventory station having an inventory subassembly for holding containers and for moving containers in a longitudinal direction through the inventory station;
a docking station;
a container docking subassembly and having a container transfer means for moving a container from the inventory station to a docked position at the docking station;
the processing section including:
a container opener assembly for engaging and removing the container door from the container at the docking station;
an extractor movable in the longitudinal direction into a container at the docking station, to move articles into or out of the container;
a plurality of processing stations in the processing section; and
a robot conveyor movable in the lateral direction along a rail in the processing section, to carry articles to and from the processing stations.

25. The system of claim 24 with the extractor further including a rotary drive for pivoting an article upwardly, from a horizontal position, to a vertical position.

26. The system of claim 24 wherein the container transfer and the robot conveyor move in directions parallel to each other, and the extractor moves in a direction perpendicular thereto.

27. The system of claim 24 wherein the interface section is sealed off from the processing section, except at a door opening in a wall at the docking station.

28. The system of claim 27 wherein the door opening in the wall is larger than the container door, and further including a hatch interface for moving the container door through the door opening in the wall and into the processing section.

29. The system of claim 28 with the hatch interface including a longitudinal actuator attached to a hatch cover, for moving the hatch cover towards and away from the wall, and a vertical actuator supporting the longitudinal actuator, for moving the hatch cover vertically.

30. The system of claim 24 wherein the extractor includes a carriage on a guide track extending perpendicular to the robot conveyor rail, with the guide track vertically movable along a vertical drive column, a rotary drive on the carriage, and a comb assembly attached to the rotary drive.

* * * * *